United States Patent
Zinevich

(10) Patent No.: US 9,179,337 B2
(45) Date of Patent: Nov. 3, 2015

(54) PRIORITIZING REPAIR OF SIGNAL LEAKAGE IN AN HFC NETWORK

(71) Applicant: ARCOM DIGITAL, LLC, Syracuse, NY (US)

(72) Inventor: Victor M. Zinevich, Voronezh (RU)

(73) Assignee: ARCOM DIGITAL, LLC, Syracuse, NY (US)

( * ) Notice: Subject to any disclaimer, the term of this patent is extended or adjusted under 35 U.S.C. 154(b) by 0 days.

(21) Appl. No.: 14/456,492

(22) Filed: Aug. 11, 2014

(65) Prior Publication Data

US 2015/0181442 A1    Jun. 25, 2015

Related U.S. Application Data

(60) Provisional application No. 61/919,307, filed on Dec. 20, 2013.

(51) Int. Cl.
| | |
|---|---|
| *H04N 17/00* | (2006.01) |
| *H04W 24/02* | (2009.01) |
| *H04J 11/00* | (2006.01) |
| *H04L 12/26* | (2006.01) |
| *H04L 12/24* | (2006.01) |
| *G01R 31/00* | (2006.01) |
| *G01R 31/02* | (2006.01) |
| *H04L 12/28* | (2006.01) |
| *H04N 21/442* | (2011.01) |
| *H04N 21/61* | (2011.01) |
| *H04N 21/2383* | (2011.01) |

(Continued)

(52) U.S. Cl.
CPC .............. *H04W 24/02* (2013.01); *G01R 31/002* (2013.01); *G01R 31/025* (2013.01); *H04J 11/0023* (2013.01); *H04L 12/2801* (2013.01); *H04L 41/0609* (2013.01); *H04L 41/0618* (2013.01); *H04L 43/08* (2013.01); *H04N 21/2383* (2013.01); *H04N 21/4382* (2013.01); *H04N 21/44209* (2013.01); *H04N 21/6118* (2013.01); *H04B 17/318* (2015.01); *H04B 17/345* (2015.01)

(58) Field of Classification Search
CPC ....................................................... H04N 17/00
USPC ................... 375/227, 257, 346; 455/423, 424
See application file for complete search history.

(56) References Cited

U.S. PATENT DOCUMENTS

| | | | |
|---|---|---|---|
| 5,371,760 A | 12/1994 | Allen et al. | 375/1 |
| 5,752,164 A | 5/1998 | Jones | 455/33.1 |

(Continued)

OTHER PUBLICATIONS

Hranac, Ron, "A Novel Approach to Troubleshooting Linear Distortions," Oct. 1, 2010, pp. 1-3, Communications Technology Magazine, Access Intelligence, LLC, Rockville, MD.

(Continued)

*Primary Examiner* — Kevin Kim
(74) *Attorney, Agent, or Firm* — Lawrence P. Trapani, Esq.

(57) ABSTRACT

A method or apparatus of identifying for repair a signal leak in an HFC network, wherein a base transceiver station in the vicinity of the HFC network transmits a BTS signal over-the-air. The method comprises or apparatus performs the steps of: (a) identifying a location of the signal leak; (b) in the vicinity of the signal leak, detecting the BTS signal; (c) determining a level of the BTS signal; (d) defining a threshold level; (e) with the use of a processor, determining whether the level of the BTS signal meets or exceeds the threshold level; and (f) indicating for repair the signal leak if the level of the BTS signal meets or exceeds the threshold level.

37 Claims, 10 Drawing Sheets

(51) Int. Cl.
*H04N 21/438* (2011.01)
*H04B 17/318* (2015.01)
*H04B 17/345* (2015.01)

(56) References Cited

U.S. PATENT DOCUMENTS

| | | | |
|---|---|---|---|
| 6,385,237 B1 | 5/2002 | Tsui et al. | 375/228 |
| 6,405,043 B1 | 6/2002 | Jensen et al. | 455/446 |
| 6,625,745 B1 | 9/2003 | Johnson et al. | 714/4 |
| 8,154,303 B2 | 4/2012 | Maxon et al. | 324/532 |
| 8,456,530 B2 | 6/2013 | Zinevich | 348/192 |
| 8,578,437 B2 | 11/2013 | Nielsen et al. | 725/125 |
| 9,100,290 B2 | 8/2015 | Couch | 455/422.1 |
| 2002/0094785 A1 | 7/2002 | Deats | 455/67.3 |
| 2003/0040277 A1 | 2/2003 | Deats | 455/63 |
| 2005/0062475 A1 | 3/2005 | Nakanishi et al. | 324/326 |
| 2005/0120196 A1 | 6/2005 | Zito | 713/100 |
| 2011/0043640 A1* | 2/2011 | Zinevich | 348/192 |
| 2011/0085456 A1 | 4/2011 | Zimmerman | 370/252 |
| 2012/0116697 A1 | 5/2012 | Stelle, IV | 702/59 |
| 2013/0051239 A1 | 2/2013 | Meredith et al. | 370/241 |
| 2013/0064279 A1 | 3/2013 | Nielsen et al. | 375/227 |
| 2013/0316750 A1 | 11/2013 | Couch | 455/501 |
| 2014/0105251 A1* | 4/2014 | Bouchard | 375/141 |

OTHER PUBLICATIONS

Effigis, "The Ultimate Continuous Monitoring System, CPAT® Continuous Monitoring System," Oct. 13, 2010, pp. 1-3, Effigis formerly VGI Solutions, Montreal, Canada.
CableLabs, DOCSIS® Best Practices and Guidelines, Proactive Network Maintenance Using Pre-Equalization, CM-GL-PNMP-V02-110623, Jun. 22, 2011, pp. 11-77, Cable Television Laboratories, Inc., Louisville, CO.
Arcom Digital LLC, Xcor® Client User Guide, Xcor-CUG-v.3.0.4, Jul. 28, 2011, pp. 8-55, Arcom Digital LLC, Syracuse, NY.
Ron Hranac, "Some Thoughts on LTE Interference," Oct. 1, 2011, pp. 1-3, Cablefax, http://www.cablefax.com/archives/some-thoughts-on-lte-interference.
Ron Hranac, "LTE Interference (Part 2)," Nov. 1, 2011, pp. 1-3, Cablefax, http://www.cablefax.com/archives/lte-interference-part-2.
Paul Denisowski, "Recognizing and Resolving LTE/CATV Interference Issues" White Paper, Mar. 1, 2012, pp. 1-8, Rohde & Schwarz, Columbia, MD, http://www.cedmagazine.com/white-papers/2012/06/recognizing-resolving-lte-cable-tv-interference-issues.
Arcom Digital LLC, Detecting Leakage of Digital Channels in an HFC Network, White Paper, May 1, 2012, pp. 2-5, Arcom Digital LLC, Syracuse, NY.
Arcom Digital LLC, QAM Snare® Detect and Locate Leakage From Digital Channels, Brochure, Aug. 21, 2012, pp. 1-3, Arcom Digital LLC, Syracuse, NY.
Arcom Digital LLC, "QAM Snare® Navigator, A Tool That Enables Line Techs to Locate Digital Leaks," Brochure, Oct. 10, 2012, pp. 1-3, Arcom Digital LLC, Syracuse, NY.
Hranac, Ron & Tresness, Greg, "Another Look at Signal Leakage, The Need to Monitor at Low and High Frequencies," SCTE Technical Paper, Oct. 17, 2012, pp. 3-31, SCTE, Exton, PA.
Hranac, Ron & Tresness, Greg, "Another Look at Signal Leakage, The Need to Monitor at Low and High Frequencies," SCTE Slide Presentation, Oct. 17, 2012, pp. 2-12, SCTE, Exton, PA.
Paul Denisowski, "Evolving Challenges in LTE/Cable Interference Issues," White Paper, Nov. 6, 2012, pp. 2-9, Rohde & Schwarz, Columbia, MD.
Zinevich, Victor & Tresness, Greg, "Quantifying Leakage Thresholds for QAM/LTE Interference," Feb. 11, 2013, pp. 1-28, Arcom Digital LLC, Syracuse, NY.
JDS Uniphase Corp., "EdgeTrak™ Remote, Downstream Visibility at the True Network Edge—the CPE, Communications Test & Measurement Solutions," Brochure, May 31, 2013, p. 1, JDS Uniphase Corporation, Milpitas, CA.
Rohde & Schwarz, "Evolving Challenges in LTE/Cable Interference Issues," White Paper, Jul. 18, 2013, pp. 1-18, Rohde & Schwarz, Columbia, MD, http://cdn.rohdeschwarz.com/pws/dl_down loads/dl_common_librarydl_brochures_and_datasheets/pdf_1/Evolving_CATVLTE_bro_en_3606-8514-62_v0100.pdf.
Trilithic, Inc., "Plant Leakage Management," Aug. 28, 2013, pp. 1-4, Trilithic, Inc., Indianapolis, IN.
Effigis, "CPAT® DRV3 / DSG1, Portable Digital Leakage Detector / Digital Signal Generator," Sep. 5, 2013, pp. 1-2, Effigis formerly VGI Solutions, Montreal, Canada.
Hranac, Ron & Segura, Nick, UHF Signal Leakage and Ingress, Understanding the Challenges, SCTE Technical Paper, Oct. 21, 2013, pp. 1-18, SCTE, Exton, PA. http://4g-portal.com/signal-leakage-and-ingress-at-higher-frequencies-understanding-the-challenges-technical-paper.
EPO, PCT/US2014/071755 Application, Partial International Search Report, Apr. 16, 2015, pp. 1-4, WIPO, Geneva, CH.
EPO, PCT/US2014/071755 Application, International Search Report, Jul. 14, 2015, pp. 1-5, WIPO, Geneva, CH.
EPO, PCT/US2014/071755 Application, Written Opinion of the International Searching Authority, Jul. 14, 2015, pp. 1-12, WIPO, Geneva, CH.

* cited by examiner

REPAIR PRIORITIES

| Leak Level | LTE Level | QAM Egress Priority | LTE Ingress Priority (Low QAM Level) | LTE Ingress Priority (Medium QAM Level) | LTE Ingress Priority (High QAM Level) |
|---|---|---|---|---|---|
| L | L | L | H | L | L |
| L | H | L | H | L | L |
| H | L | L | H | H | L |
| H | H | H | H | H | H |

US 9,179,337 B2

PRIORITIZING REPAIR OF SIGNAL LEAKAGE IN AN HFC NETWORK

CROSS-REFERENCE TO RELATED APPLICATIONS

This application claims the benefit of U.S. Provisional Application No. 61/919,307, filed Dec. 20, 2013.

BACKGROUND OF THE INVENTION

1. Field of Invention

The present invention relates generally to detecting, locating and repairing signal leaks in a hybrid fiber-coax (HFC) network, and more particularly to a system and method of prioritizing the repair of such signal leaks.

2. Background Art

The advent of wireless Long Term Evolution (LTE) 4G technology has required the cable television industry to re-evaluate the signal leakage detection processes and to include detection of leaking QAM channel signals at frequencies at or near the LTE band. Since the 1980's, the FCC has defined monitoring requirements and allowable cumulative signal leakage limits for all cable television networks carrying channels in the aeronautical band. As a result of required compliance efforts, as well as good construction, management, and workmanship practices, cable networks have had relatively high signal integrity at the aeronautic frequencies. But, detection of signal leakage in the aeronautical band may have little correlation with signal leakage in the LTE band, and leak mitigation efforts in the aeronautical bands may not have a corresponding benefit in mitigating leaks in the LTE band. Until recently, technology that allowed cable network operators to detect and measure leaking QAM channels at or near LTE frequencies was not available. Thus, cable operators had minimal visibility of these higher frequency leaks. As a result, there are numerous leaks that exist at the LTE band. Generally, there may be an average of one LTE leak per cable plant mile. It is unrealistic to attempt to repair all such leaks.

With the existence of so many higher frequency leaks in the cable network, there is a need to have an intelligent method of prioritizing such leaks, in order to focus on those that are most likely to adversely affect the cable network (i.e., be "network affecting") or an LTE network in the vicinity of the cable network (i.e., by way of egress). Egress of QAM signals from the cable network can adversely affect the LTE base transceiver station (BTS) performance by raising the BTS receiver noise floor and effectively decreasing the coverage area. Ingress of LTE signals (from BTS transmitters) entering the cable network through the leak can adversely affect the quality of signal transmission of the QAM channels downstream of the leak. Thus, from a quality of service and customer satisfaction perspective it is important to quickly react to repair these leaks.

Basing repair decisions solely upon the amplitude of the detected leak may not result in the most network, affecting leaks being identified. The LTE signal strength at the leak location should also be considered. For example, a leak that is located relatively far from a LTE BTS transmitter, where the LTE level at the leak is very low or non-existent, should have a relatively low priority to repair. This is so because it is unlikely that egress from that distant leak location will affect the LTE BTS performance or that the LTE signal ingress will affect the quality of the QAM signals in the network. Comparing this to a leak of the same amplitude in close proximity to the LTE BTS, where the LTE signal strength is very high, the likelihood of both ingress and egress-related impairments is high. Therefore, this leak should have a relatively high priority.

OBJECTS AND SUMMARY OF THE INVENTION

It is therefore an object of the present invention to provide apparatus and methods that overcome the problems of the prior art.

It is another object of the present invention to provide apparatus and methods of prioritizing the repair of RF signal leaks in a cable network.

It is a further object of the present invention to provide apparatus and methods of prioritizing the repair of an RF signal leak in a cable network based on the amplitude level of the leak ("leak level") and the receive signal level of an over-the-air RF signal transmitted from a nearby BTS ("BTS signal level").

It is still another object of the present invention to provide apparatus and methods of prioritizing the repair of an RF signal leak based on the signal level of a RF forward path signal in the cable network, at or near the leak.

It is still a further object of the present invention to provide apparatus and methods of prioritizing the repair of an RF signal leak based on leak level, BTS signal level, and the signal level of a RF forward path signal in the cable network at or near the leak.

These and other objects are attained in accordance with the present invention, wherein there are provided an apparatus and a method for prioritizing the repair of an RF signal leak in an HFC network, comprising, in an exemplary embodiment, means for or steps of: (a) detecting an RF leak at a first frequency band and measuring the amplitude level of the leak; (b) measuring at a second frequency band a received signal level (or BTS signal level) of an over-the-air RF signal transmitted from a nearby BTS ("BTS signal"); (c) determining a location of the RF leak; (d) associating the leak level and the BTS signal level with each other and with the location of the RF leak; (e) defining a priority threshold based on the BTS signal level or a BTS distance (hereinafter defined); and (f) assigning a repair priority to the RF leak based on whether or not the priority threshold has been exceeded.

In another embodiment, there is provided an apparatus and a method for prioritizing the repair of an RF signal leak, comprising, means for or steps of: (a) detecting an RF leak in an HFC network at a first frequency band and measuring the amplitude level of the leak; (b) measuring a BTS signal level of a BTS signal at a second frequency band; (c) determining a location of the RF leak; (d) associating the leak level and the BTS signal level with each other and with the location of the RF leak; (e) obtaining a forward path signal level associated with the location of the leak; (f) defining a priority threshold based on the forward path signal level and BTS signal level (or BTS distance); and (g) assigning a repair priority to the RF leak based on whether or not the priority threshold has been exceed.

In a further embodiment, there is provided an apparatus and a method for assessing whether ingress from a local BTS entering a leak in an HFC network will interfere with forward path signals in the network. The apparatus and method comprises, means for or steps of: (a) detecting an RF leak in an HFC network or node at a first frequency band and determining a location of the leak; (b) detecting an RF signal transmitted from the local BTS (BTS signal) at a second frequency band; (c) requesting samples of a forward path signal and/or measurements of signal quality parameters of the forward path signal, from a modem or modems associated with the leak location or with the HFC network or node; (d) during a first sampling interval, sampling the BTS signal to produce BTS signal samples; (e) during the first sampling interval, sampling the forward path signal to produce forward path signal samples and/or measuring the signal quality parameters of the forward path signal to produce forward path signal quality data, at a channel that includes the second frequency band; (f) cross correlating the forward path signal samples with the BTS signal samples and generating a correlation function, and/or assessing the forward path signal quality data; and (g) assigning a repair priority to the RF leak based on the correlation function and/or the assessment of the forward path signal quality data.

BRIEF DESCRIPTION OF THE DRAWING

Further objects of the present invention will become apparent from the following description of the preferred embodiments with reference to the accompanying drawing, in which.

DETAILED DESCRIPTION OF THE PREFERRED EMBODIMENT

Figure 1:
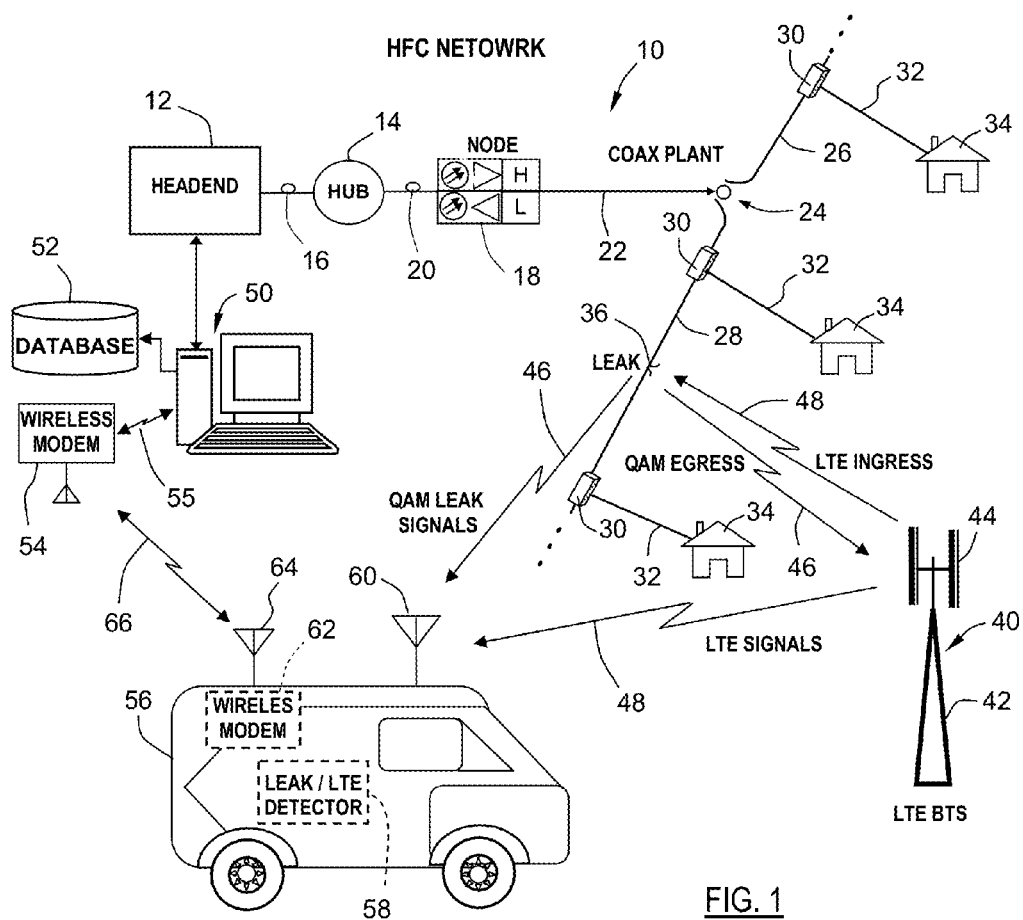
FIG. 1 is a block diagram and schematic illustration of one embodiment of a system for prioritizing the repair of RF leaks in an HFC network, according to the present invention.

The QAM Snare® system, manufactured by Arcom Digital, LLC, Syracuse, N.Y., detects and locates QAM leakage in a CATV cable network, utilizing a cross-correlation process and a time-difference of arrival (TDOA) algorithm. The leakage detection process can be summarized as follows. Samples of a QAM channel are captured at a location within the network and time stamped using a Global Positioning System (GPS) reference clock. These samples are treated as a reference and are called "reference samples." The reference samples are subsequently transmitted over a wired or wireless network to a leakage detector in the field, which is likely installed in a technician vehicle (e.g., the QAM Snare® Monitor™ or Navigator™ leakage detector by Arcom Digital, LLC). The leakage detector similarly uses a GPS reference clock for timing synchronization. The detector receives over-the-air QAM signals leaked from the network, via a locally connected antenna. The detector samples the QAM leakage signals and time stamps the samples. The detector then performs a cross-correlation of the QAM reference samples and the QAM leakage samples of the same QAM channel, sampled during the same sampling interval. A correlation peak indicates leak detection. This cross-correlation process has been optimized for efficient data transmission, and utilizes an accumulation time of 1 ms. The correlation process is repeated one or more times per second. When leakage is detected, the amplitude of the detected leak is determined. Also, time delays are determined between where the reference samples are acquired in the network and the detector locations. In order to accurately calculate the actual GPS location of the leak, a TDOA technique is employed using differences between measured time distances and the GPS coordinates of multiple detection points. The QAM leakage detection and location system is describe in further detail in U.S. Pat. No. 8,456,530 (Jun. 4, 2013) to Zinevich, which is incorporated herein by reference.

Different leaks have different frequency responses. In order to measure leaks in the LTE frequency band and in the aeronautical frequency band, as mandated by the FCC, it is necessary to measure leakage of QAM channels at multiple frequencies. Arcom Digital's QAM Snare® system performs this function by tuning quickly between frequencies. During the first 1 ms of a detection interval (e.g., 1 second), the QAM Snare® detector correlates on one channel, and during the first 1 ms of the second half of the same detection interval, the detector correlates on a second channel. Other configurations are possible when leakage measurements are to be made at more than two channels. Leakage measurements of two channels utilizes only about 0.2% (i.e., 2 ms) of the detection interval. The detector's correlation processor is largely inactive for the remainder of the interval. In one embodiment of the present invention, this inactive time is used to scan through the LTE BTS downlink frequencies and measure the LTE BTS signal level (i.e., LTE signal level or LTE level) over the entire LTE band. Thus, the present invention can be implemented in Arcom Digital's QAM Snare® system without compromising the leakage detection and location functions or incurring additional hardware cost.

Referring now to FIG. 1, there is shown a schematic illustration of an embodiment of the present invention and its operational environment. Shown is an HFC network 10, comprising a headend 12, a hub 14 coupled to headend 12 by optical fiber 16, at least one fiber optic node 18 coupled to hub 14 by optical fiber 20, a coaxial cable trunk line 22 connected to the output of node 18, a power splitter 24 connected to trunk line 22, two coaxial branch cables 26, 28 connected to the outputs of splitter 24, subscriber taps 30 distributed along each branch cable 26, 28, and drop cables 32 connected between subscriber taps 30 and subscriber premises 34, respectively. HFC network 10 contains a leak 36 in branch cable 28, as indicated. Usually, a leak is associated with a network device or connector. In the vicinity of HFC network 10 is a LTE base transceiver station (BTS) 40, which includes a tower 42 and antennas 44. Leak 36 is shown emitting QAM TV channel signals 46 as egress and receiving LTE signals 48 as ingress. LTE signals 48 are transmitted from BTS 40. At headend 12, there is a network server 50 (i.e., computer processor, display, keyboard, mouse, etc.) communicating with headend 12 (e.g., via web services or IP network), a network database 52 containing network maps, data overlays and other data (e.g., device locations, propagation delays, leak locations, leak levels, LTE signal levels, QAM signal levels, etc.), and a wireless modem 54 communicating with server 50 via a wireless or wired network 55. Lastly, FIG. 1 shows a service vehicle 56 on a drive out through HFC network 10. Vehicle 56 is equipped with a QAM Snare® Monitor™ or Navigator™ leakage detector 58 manufactured by Arcom Digital, LLC. Leakage detector 58 has been modified to include, in addition to its QAM leakage detection and location functions, the capability of detecting LTE signals 48 from the BTS 40, measuring the LTE signal level, associating geographic coordinates to these measurements, and in some cases, determining the location of BTS 40 (hereafter, the modified leakage detector will be referred to as the "leakage/LTE detector").

FIG. 1 shows QAM egress (or leakage) signals 46 being received by an antenna 60 mounted on vehicle 56. Antenna 60 is coupled not shown) to leakage/LTE detector 58. Antenna 60 is shown also receiving LTE signals 48 from BTS 40 for the LTE signal level measurement. Service vehicle 56 also contains a wireless modem 62 and a modem antenna 64 mounted on vehicle 56. Modem 62 communicates with leakage/LTE detector 58 via a local network and with server 50 at headend 12 via a wireless network 66. Time stamped reference samples of the QAM channel signals are sent to leakage/LTE detector 58 in vehicle 56 from headend 12, via wireless modem 54 and wireless network 66. This step, as well all other leakage detection and location steps, are implemented in Arcom Digital's QAM Snare® system and are described in U.S. Pat. No. 8,456,530. Wireless modem 62 may also be used to send leakage level and location data, LTE signal level data, and geographic coordinates from service vehicle 56 to server 50. In a like manner, instructions may be sent from service vehicle 56 to server 50 to initiate the addressing of cable modems in subscribers' premises, for measurement of signal quality metrics and/or to acquire samples of forward path signals. Further, wireless modems 54, 62 and wireless network 66 may be used to send electronic maps, overlay data, and other data from server database 52 to detector 58.

Two approaches to leakage and LTE signal detection are currently contemplated; however, the invention is not so limited. The first approach measures the LTE signal level simultaneously with the leakage detection and location process, using the same equipment (e.g., the QAM Snare® system). The second approach uses separate LTE detection and measurement hardware in parallel with the leakage detection and location equipment. In either case, both LTE signal level data and digital leakage data are sent to the server database for prioritizing. Also, in either case, the location of the LTE signal level measurement is associated with the location of the leak level measurement. This is done directly in the first approach, in which LTE signal level and leak level measurements are taken simultaneously and geographic coordinates (e.g., from a GPS receiver) are recorded for both measurements or both measurements are made to point to the same coordinates. In the second approach, for example, the detectors would record geographic coordinates for each of their respective measurements, and the pairing of LTE signal level and leak level measurements would occur separately by matching the coordinates. In both approaches, each LTE signal level measurement is also (or as an alternative to measurement location) associated with the location of the leak, which is determined by, e.g., the QAM Snare® system.

The LTE signal level is measured at the detector location, not at the leak location. However, typically, the leak location is not far from the drive route points where the leak and LTE levels are measured (i.e., the detector location). The distance is typically 10 to 30 meters. But, the distance from the detector location or the leak location to the BTS is much greater (e.g., 100 to 500+ meters). Thus, under these conditions, it can be said that the LTE level measured at the detector is approximately the same as if measured at the leak. In the worst case, the LTE levels at the leak and the detector will differ by 130/100=1.3 Volts/m or 2 dB. Typically, it will differ by less then 1 dB.

Figure 2:
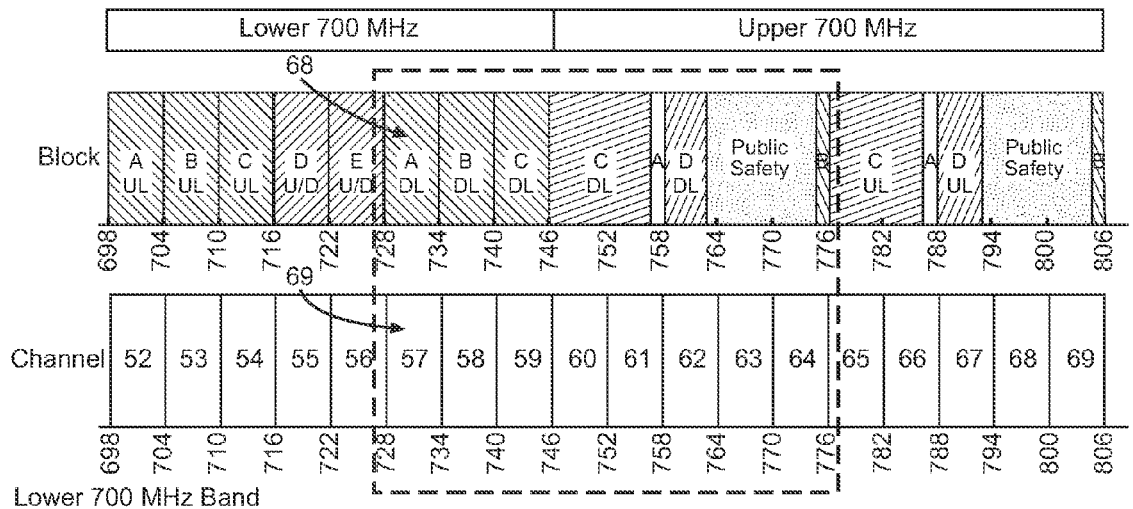
FIG. 2 is a diagram of the LTE downlink and public safety frequency band and channel plan utilized in the United States.
Figure 3:
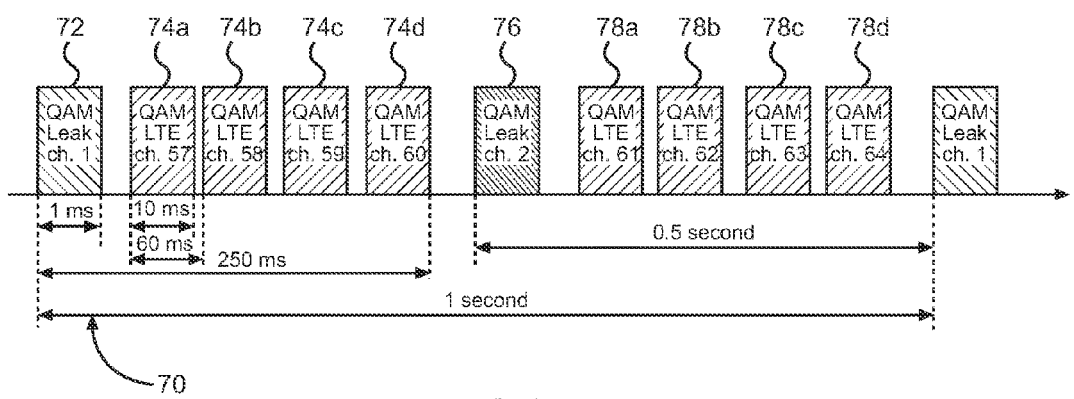
FIG. 3 is a diagram showing the timing of scanning the LTE downlink and public safety frequencies ("LTE frequencies") and of detecting over-the-air signals transmitted on these LTE frequencies, and also showing CATV QAM channels that are co-channel to the LTE frequencies.

Referring now to FIG. 2, the LTE downlink and public safety frequencies 68 utilized in the United States are shown. Downlink and public safety frequencies 68 are between 728 MHz and 776 MHz. This corresponds to UHF cable television frequencies 69, shown here as cable channels 57 to 64 (or IRC cable channels 113-120). FIG. 3 shows the preferred method of how the channel bands are scanned by leakage/LTE detector 58. In the first half of a one-second detection interval 70, the first 1 ms 72 is reserved for the leakage detection and location process. Subsequently, four QAM channel bands 74a-74d (e.g., Channels 57-60) that are co-channel to LTE downlink frequencies (e.g., 728-752 MHz) are scanned. It takes approximately 10 ms to scan each channel band and 50 ms to tune to the next band. For each scan, the LTE level is measured and stored in memory. The process is repeated during the second half of one-second detection interval 70, with leakage detection and location occurring in another 1 ms period 76 and the next four QAM channel bands 78a-78d (e.g., Channels 61-64) are scanned. Thus, in every one-second interval, the entire LTE downlink and public safety frequencies are covered.

Leakage/LTE detector 58 (FIG. 1) includes a FFT spectrum analyzer with equivalent resolution bandwidth of approximately 30 kHz. In one embodiment, the spectrum analyzer measures a maximum level of the LTE signal within the LTE downlink band. Then, a "worse case" LTE level is calculated based on the assumptions that: (1) there is no fading; (2) the LTE spectrum (orthogonal frequency domain modulation—OFDM) is flat within the full band; and (3) the above-measured peak level is maintained over the 30 kHz resolution bandwidth. These assumptions correspond to a worst case with respect to the impact of both LTE ingress on the HFC network and HFC network egress on the LTE BTS. For example, if the maximum level measured by the spectrum analyzer is −80 dBm (over 30 kHz), then the worse case LTE level for a 5 MHz downlink bandwidth is equal to: −80 dBm+ 10 Log (5×10^6/3×10^4)=−57.78 dBm. This is a conservative approach that helps avoid mistakes in prioritizing leaks. Of course, the present invention is not limited to using this particular value for LTE signal level. For the purpose of this application and the claims, the terms "LTE signal level," "LTE level," or more generally "BTS signal level" may represent any recognized signal strength or receive signal power measurement, such as, e.g., Reference Signal Receive Power (RSRP), Receive Signal Strength indicator (RSSI), maximum carrier or subcarrier amplitude, average carrier or subcarrier amplitude, and the like.

Figure 4:
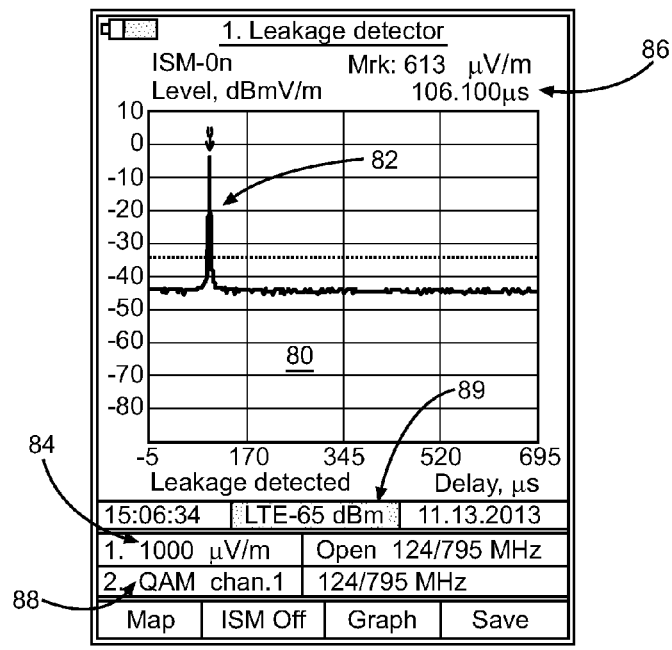
FIG. 4 is a screen shot of a graph generated by a leakage/LTE detector of the present invention, showing a cross-correlation function, which represents a detected leak, and also showing a level of the leak, time delay, detection channel, and LTE signal level ("LTE signal level" and "LTE level" mean the BTS signal level of a BTS signal at an LTE frequency)

An output 80 of leakage/LTE detector 58 (i.e., a graph) is shown in FIG. 4. The graph displays a correlation function 82 as well as the detected leak level 84, the time delay 86, detection channel 88 (QAM chan. 1), and the LTE level 89 (LTE −65 dBm), which is preferably the maximum of the LTE levels measured in the entire scanned LTE and public safety bands. As related to the claimed invention, both the detected leak level 84 and corresponding LTE level 89 are displayed for the technician. For each one-second detection interval, the detected leak data, GPS coordinates, detection channel, and LTE level are transmitted (via wireless network 66) to network server 50 at headend 12, where the information is stored in server database 52 (FIG. 1). The LTE level in the vicinity of a detected leak is preferably measured at several detector locations (on the service vehicle route) and the measurements are then averaged to produce the LTE level for the leak.

Figure 5:
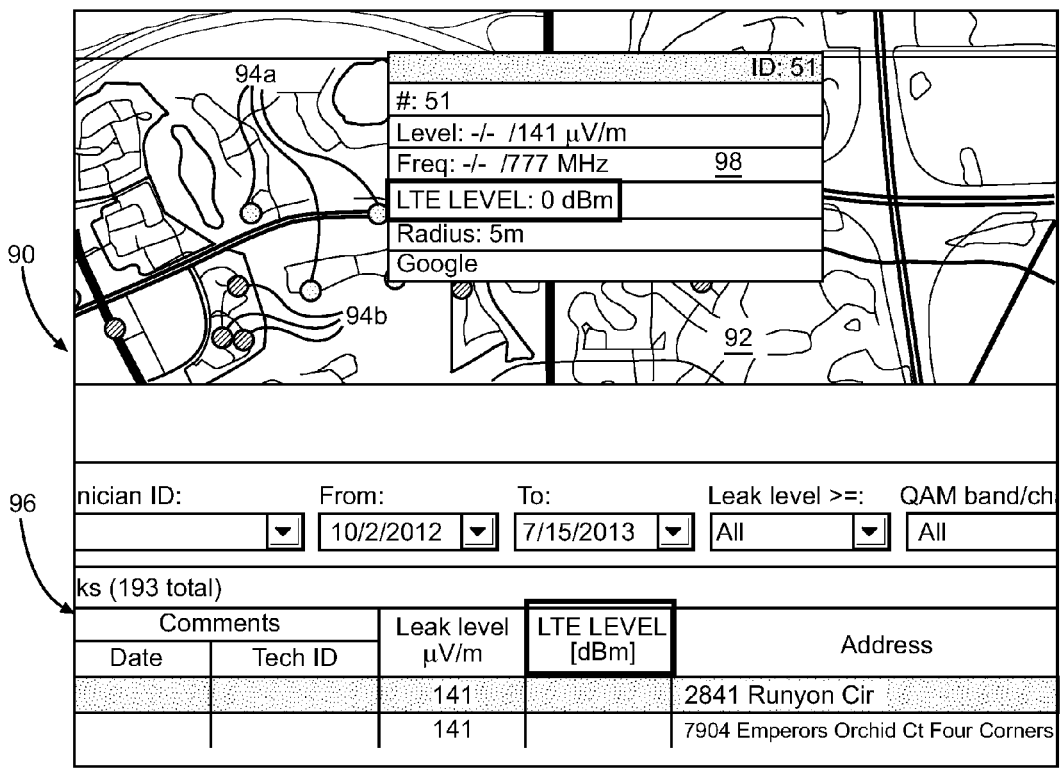
FIG. 5 is an illustration of a user interface screen display generated by software on a server of the system of FIG. 1.

FIG. 5 shows a user interface screen display 90 generated by software running on server 50 of the system in FIG. 1. This particular interface is used to display information about detected leaks and includes a map 92 displaying icons 94a and 94b. Icons 94a and 94b (e.g., small red and yellow circles) represent the leaks and they are place on map 92 at the calculated leak locations. Icons 94a are colored red to indicate the most severe leaks, i.e., those leaks most likely to disrupt cable network 10 and/or interfere with nearby BTS 40. Icons 94b are colored yellow to indicate less severe and lower priority leaks. The leak level and corresponding LTE level are available in a table 96 below the map or in a popup window 98, so the operator can use this data to prioritize repairs and generate work order lists. The interface will aid operators in their effort to address leaks most likely to affect the network. Procedurally, in one embodiment, cable operators may fix those leaks with the measured LTE level above a first threshold and the leak level above a second threshold. As those leaks are fixed, the thresholds are lowered and a second group of leaks meeting the lowered thresholds are then fixed.

Figure 6:
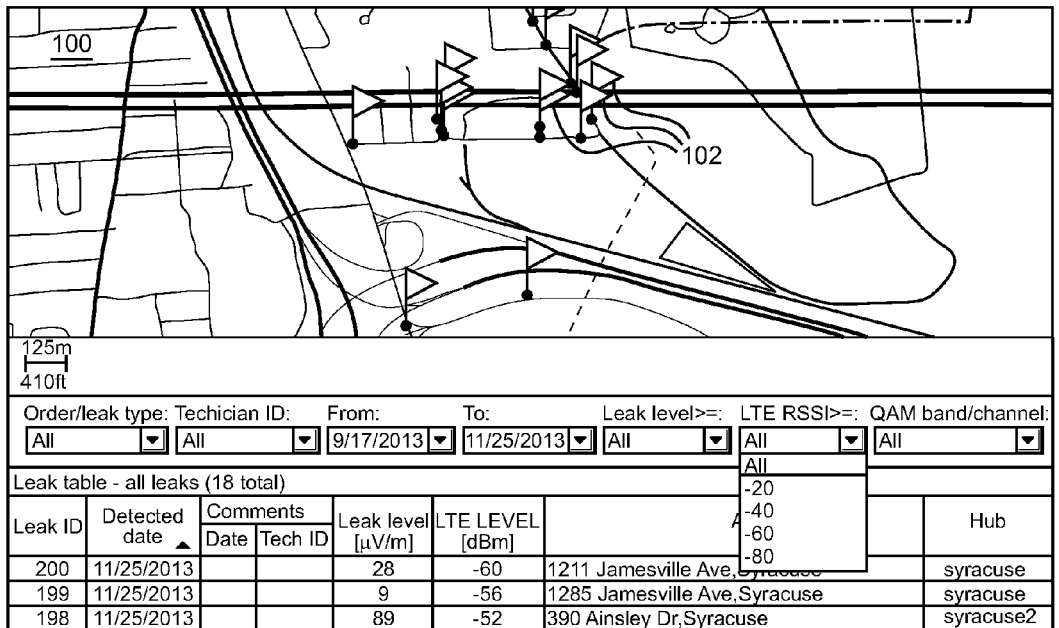
FIG. 6 is an illustration of another user interface screen display generated by the software on the server of the system of FIG. 1.

One can be selective regarding which leaks to be displayed on a map. For example, only leaks marked with a high priority may be displayed. An example of this is shown in FIG. 6, where a user interface screen display 100 displays a map. In this example, a LTE level threshold is set to −50 dBm (not shown), and the leak locations meeting this prioritizing criterion are displayed as flag icons 102 on the map. Work orders can be generated from the map screen through a pop-up window (not shown). A leakage table 104 (below the map) shows a QAM leak having a level of 89 μV/m and a LTE level of −52 dBm. Under some circumstances, this leak may be considered high (e.g., it is over 5 times the proposed FCC standard for the aeronautical band), but the LTE level just misses the −50 dBm threshold. Thus, this leak would not be considered for a work order. This example illustrates the benefit of considering both leak level and LTE level in the prioritization.

Figure 7:
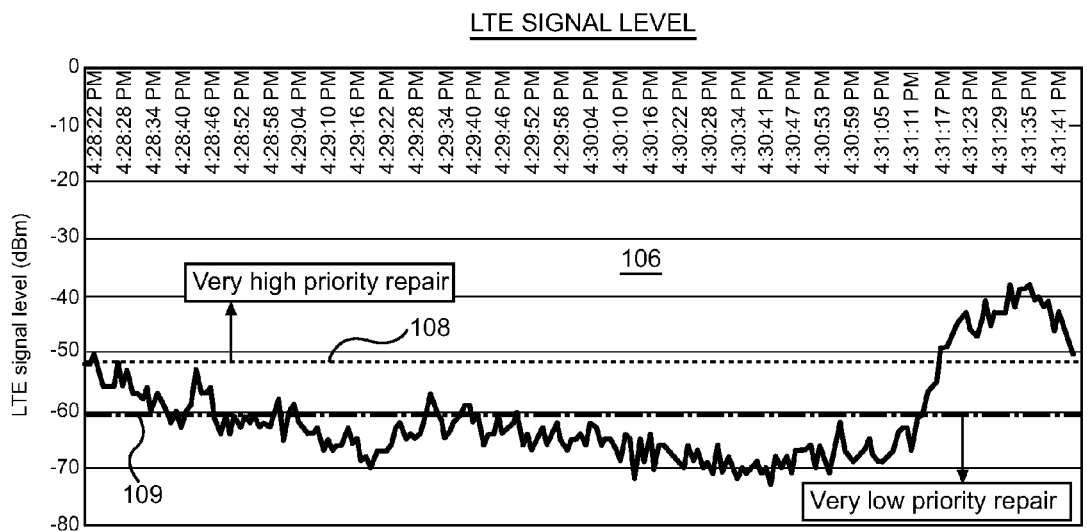
FIG. 7 is a graph of measured LTE signal level in dBm versus time in seconds, showing the variance in LTE signal level over a 50 minute drive out of a service vehicle equipped with a leakage/LTE signal detector of the present invention.

FIG. 7 shows a graph 106 of measured LTE signal level in dBm versus time in seconds, for a 50 minute drive out of service vehicle 56 with QAM Snare® leakage/LTE detector 58 (FIG. 1). Graph 106 was produced by QAM Snare® software from data exported from server database 52. Graph 106 is representative of the variance in LTE level over a 50 minute drive out. As shown in FIG. 7, an upper threshold 108 is set at −51 dBm, above which a high priority repair may be suggested, and a lower threshold 109 is set at −64 dBm, below which a low priority repair may be suggested. If the LTE level is between upper and lower thresholds 108, 109, a moderate priority may be suggested. At leak locations where the LTE level is low (e.g., leak is far from BTS), egress from even large leaks will have little or no effect on the BTS receiver performance, and therefore a low priority of repair may be set (if BTS disruption is the focus). Also, at leak locations where the LTE level is very high (e.g., leak is very close to BTS), the likelihood of a BTS disruption is high, even for moderate to low leak levels. Therefore, a high priority of repair may be set.

Figure 8:
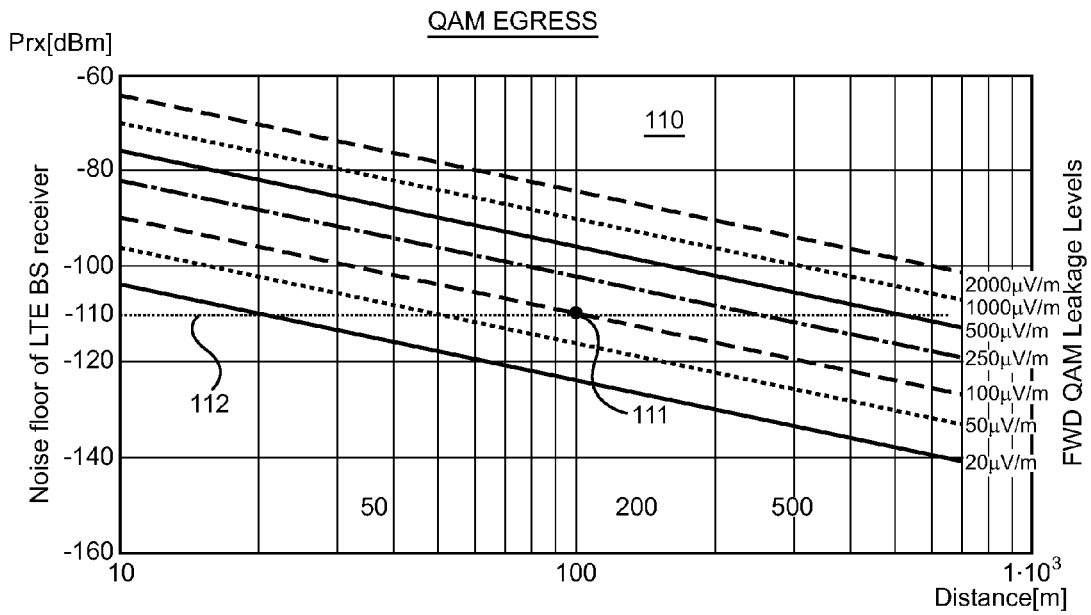
FIG. 8 is a graph containing a family of plots, plotting power $P_{RX}$ of a QAM interfering leakage signal (i.e., QAM egress) at the input of a LTE BTS versus BTS distance.

Calculations were performed in an attempt to quantify a relationship between disruptive QAM egress at the BTS versus the distance between the leak and the BTS ("BTS distance"), for a range of QAM leak levels. The results are shown in FIG. 8. FIG. 8 shows a graph 110 which plots the power $P_{RX}$ of the QAM interfering leakage signal (i.e., QAM egress) at the input of a LTE BTS versus BTS distance. The BTS has a receive antenna gain of 15 dBi (a worse-case scenario). A dotted line 112 at −110 dBm represents the noise floor of the BTS receiver. Line 112 is considered to be the level at which QAM egress begins to impact the BTS receiver (which has a bandwidth of 5 MHz). In FIG. 8, a family of plots is shown for different QAM leak levels specified at 3 meters from the leak. The −110 dBm noise floor and BTS distance (or BTS signal level) can be used to define a minimum allowable QAM leak level, which then may be set as a threshold. Leaks exceeding the threshold (for a given BTS distance or signal level) may be assigned a high or heightened priority. For example, assume the BTS distance is 100 meters. Using the plots in FIG. 8, and choosing the −110 dBm noise floor as a reference (line 112), it is determined by a point 111 that the minimum allowable leak level is 100 μV/m. It is preferred that the plots in FIG. 8 be a function of BTS signal level instead of BTS distance.

The measured LTE (or BTS) signal level is a function of BTS distance, power of the LTE transmitter, and gain of the BTS antenna (among other factors such as obstructed path loss). The typical power of most LTE transmitters is 46 dBm and antenna gain is 15 dBi. Thus, using these typical values, the measured LTE level (or BTS signal level) allows one to calculate an approximate (or at least theoretical) BTS distance, using known equations. Of course, due to multiple-input and multiple-output (MIMO) design and adaptive beam forming at the BTS, the antenna gain in the direction of the LTE level measurement may differ from a typical value and, as a result, this will cause errors in calculating an actual BTS distance. For example, an LTE level measured at 100 meters from the BTS may be less then if measured at 200 meters due to antenna beam orientation. But, from the point of view of the impact of cable plant egress on a BTS receiver, a reduced gain of the BTS antenna in the direction of the measurement has the same effect as an increased BTS distance. Thus, in such case, the BTS distance calculated from the measured LTE level (using typical values for transmit power and antenna gain) may be considered a virtual BTS distance. Other values for BTS distance may be determined from geographic data or maps, triangulation methods, experience, observation, or reasonable assumptions about BTS distances.

When prioritizing a leak for repair, the likely impact of the leak on both the cable network (e.g., LTE ingress) and the BTS (e.g., QAM egress) is generally considered. Egress is certainly important, but from a quality of service perspective, attention should be focused on LTE ingress. The question of whether a LTE signal from a BTS will interfere with a co-channel forward path (e.g., QAM) signal inside the cable plant depends, to a large degree, on the level of the forward path signal at the leak. If the LTE level is high and the forward path (QAM) signal level is also high (e.g., the leak is just after an amplifier), then it is unlikely that interference of the forward path signals will occur (except for very high leak levels, e.g., ≥500 µV/m) (see FIG. 9 and related discussion). Conversely, at a low forward path signal level (e.g., the leak is just before an amplifier), even a low level LTE signal can interfere with the forward path signals (see FIG. 11 and related discussion). Thus, LTE level and leak level will not always allow one to make a definitive decision about the effect of LTE ingress on the network. Forward path signal level at LTE frequencies should also be considered to establish more meaningful LTE ingress priorities. The forward path signal level may be derived from statistical data about the typical relationship between leak level and forward path signal level. Alternatively, cable network maps may be overlaid with previously measured and stored forward path signal levels (e.g., obtained from the server database).

To define the influence of LTE signals on forward path QAM signals in the cable plant, the carrier-to-noise ratio (CNR) parameter may be used. LTE signals look like white noise, so CNR is a reasonable parameter for LTE ingress analysis. It is assumed that the noise within the cable (absent an interfering signal) is low enough (CNR >40 dB) to be ignored. Also, the free space model of propagation of the LTE signal from the BTS to the leak is assumed, and that the LTE signal has a 5 MHz bandwidth with all its energy centered in the 6 MHz band of one QAM channel (a worst case scenario). The equation for CNR can be written as follows:

$$CNR = 2U_{QAM} - P_{Tx} - G_{Tx} - E_{Leak} + 20 \log D + OPL + 27.67 \quad (1)$$

where $U_{QAM}$ is the QAM signal level, $P_{Tx}$ is the power of the BTS transmitter, $G_{Tx}$ is the BTS transmitter antenna gain, $E_{Leak}$ is the leak field strength or level, D is the BTS distance, and OPL is the obstructed path loss (or the signal attenuation through physical objects). Equation (1) shows an interesting relationship—the degradation of CNR has a square dependency relative to QAM signal level ($U_{QAM}$). As discussed below with reference to FIGS. 9-11, this relationship significantly lowers the allowable leak level ($E_{Leak}$) in those parts of the cable plant where the QAM signal level is low (e.g., before an amplifier, within a drop cable, or within a subscriber's home).

Figure 9:
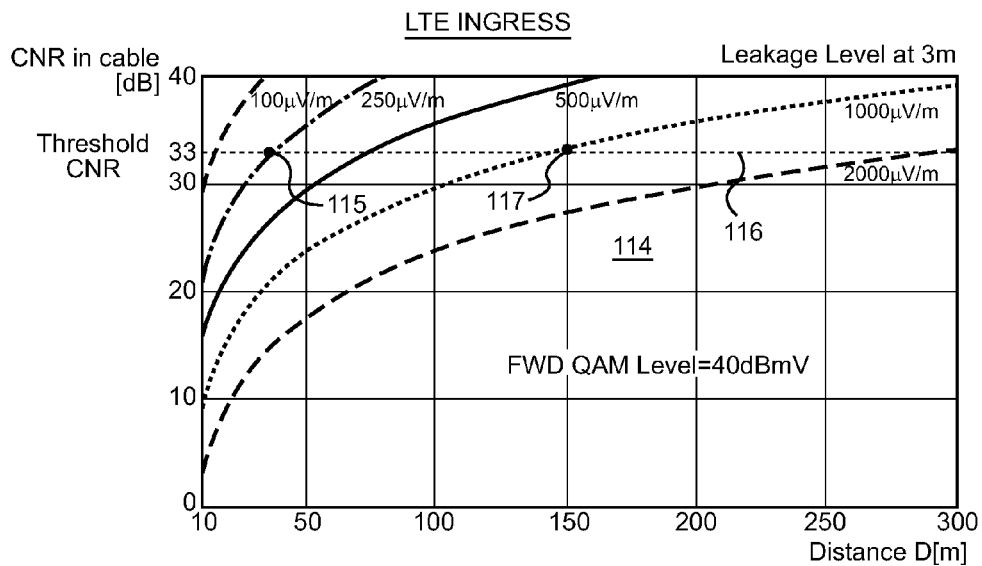
FIG. 9 is a graph containing a family of plots, plotting CNR degradation of a QAM forward path signal inside a cable plant versus BTS distance, for different leak levels, where the QAM forward path signal level is +40 dBmV.
Figure 10:
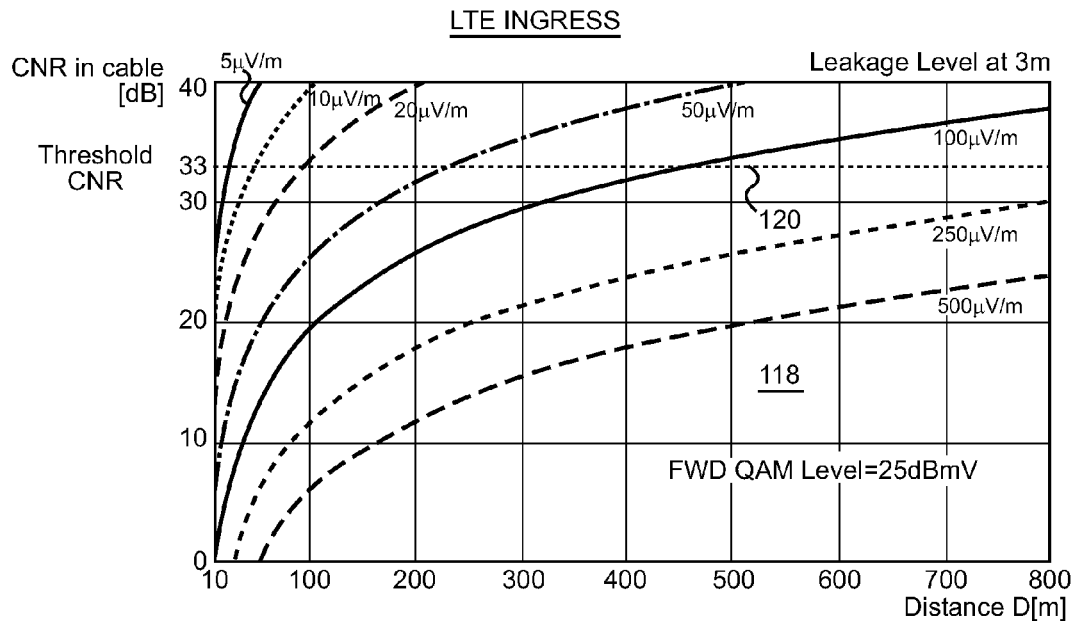
FIG. 10 is a graph containing a family of plots, plotting CNR degradation of a QAM forward path signal inside a cable plant versus BTS distance, for different leak levels, where the QAM forward path signal level is +25 dBmV.
Figure 11:
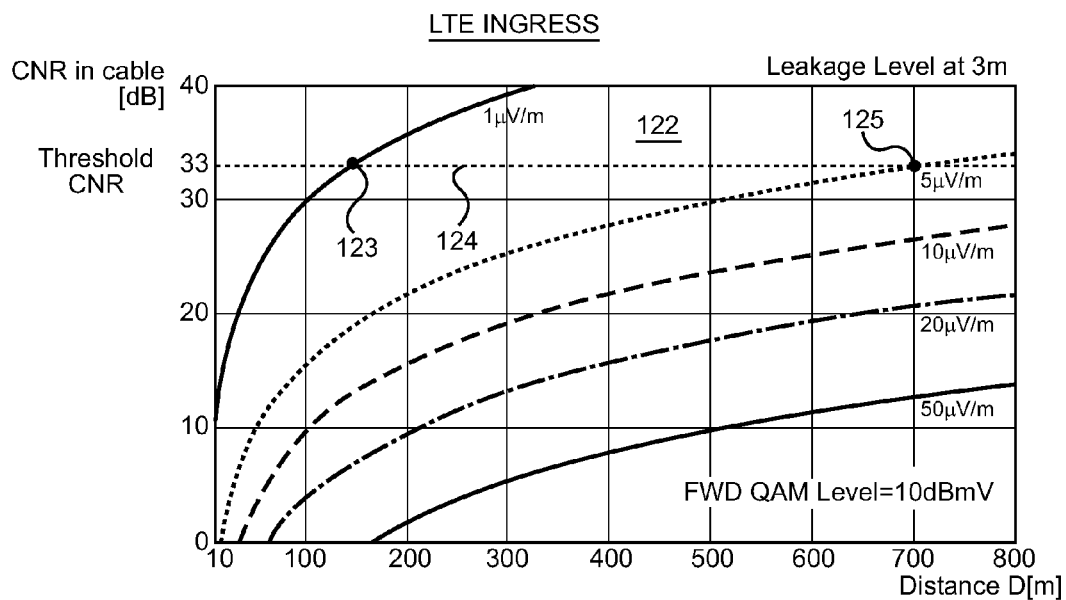
FIG. 11 is a graph containing a family of plots, plotting CNR degradation of a QAM forward path signal inside a cable plant versus BTS distance, for different leak levels, where the QAM forward path signal level is +10 dBmV.

In connection with Equation (1), typical values for the BTS parameters are: $P_{Tx}$=43 dBm and $G_{Tx}$=15 dBi. A typical value for $U_{QAM}$ in the cable plant depends, for the most part, on the location in the plant. For example, typical values might be: +5 to +40 dBmV in the trunk line; +5 to +15 dBmV in the drop line; and −10 to 0 dBmV in the home network. For leaks in the trunk and drop lines, OPL may be set to 0 dB (as a worst case) which represents a clear line-of-sight between the BTS and the trunk or drop line. For the home network, OPL is typically in the range of 15-30 dB, depending on wall materials, thickness, furniture, etc. These typical parameters were plugged into Equation (1) and three families of plots were generated and are presented in FIGS. 9-11 respectively. Plotted in FIGS. 9-11 is CNR degradation of the QAM signal versus BTS distance, for different leak levels. FIG. 9 shows a graph 114 with results for a QAM signal level of +40 dBmV, FIG. 10 shows a graph 118 with results for a QAM signal level of +25 dBmV, and FIG. 11 shows a graph 122 with results for a QAM signal level of +10 dBmV. The OPL was set to 0 dB in all cases. The horizontal dotted lines 116, 120 and 124 on graphs 114, 118 & 122, respectively, represents a CNR threshold, below which degradation of the QAM signal is likely to occur, and it is set at 33 dB for a QAM-256 signal.

Graph 114 of FIG. 9 (QAM signal level=+40 dBmV) shows, at a point 115, that LTE ingress received by a 250 µV/m leak has no effect on CNR even with a BTS distance of less than 50 meters (i.e., a high LTE level). As indicated at a point 117, even if received by a 1000 µV/m leak, LTE ingress has no effect on CNR with a BTS distance of 150 meters (but egress from this leak will affect the BTS—see FIG. 8). Contrast this with graph 122 of FIG. 11 (QAM signal level=+10 dBmV), which shows, at a point 123, that LTE ingress received by a 1 µV/m leak can degrade CNR with a BTS distance of just less than 150 meters. As indicated at a point 125, if the LTE ingress is received by a 5 µV/m leak, the CNR may degrade even if the BTS distance is 700 meters. The latter results indicate that at low QAM signal levels even very low level leaks, up to several hundred meters from the BTS, can cause CNR degradation. Thus, a high or heightened repair priority may be set for these leaks.

If FIG. 8 (effect of QAM egress on BTS) is compared with FIGS. 9-11 (effect of LTE ingress on network), it becomes clear that for a given leak in the proximity of a BTS, the negative effect of LTE ingress on forward path signals (e.g., CNR degradation) will occur at a greater distance ("affecting BTS distance") than the distance where QAM egress will have a negative effect on a BTS. This is true for most QAM signal levels (inside the cable plant), except for the highest QAM levels, such as in FIG. 9 (+40 dBmV). And, given the dependency of ingress interference on QAM signal level, the "affecting BTS distance" will increase with decreasing signal level. Stated otherwise, for most cases, the cable plant is more likely to be affected by LTE ingress than the BTS is likely to be affected by QAM egress.

Figures 12, 15:
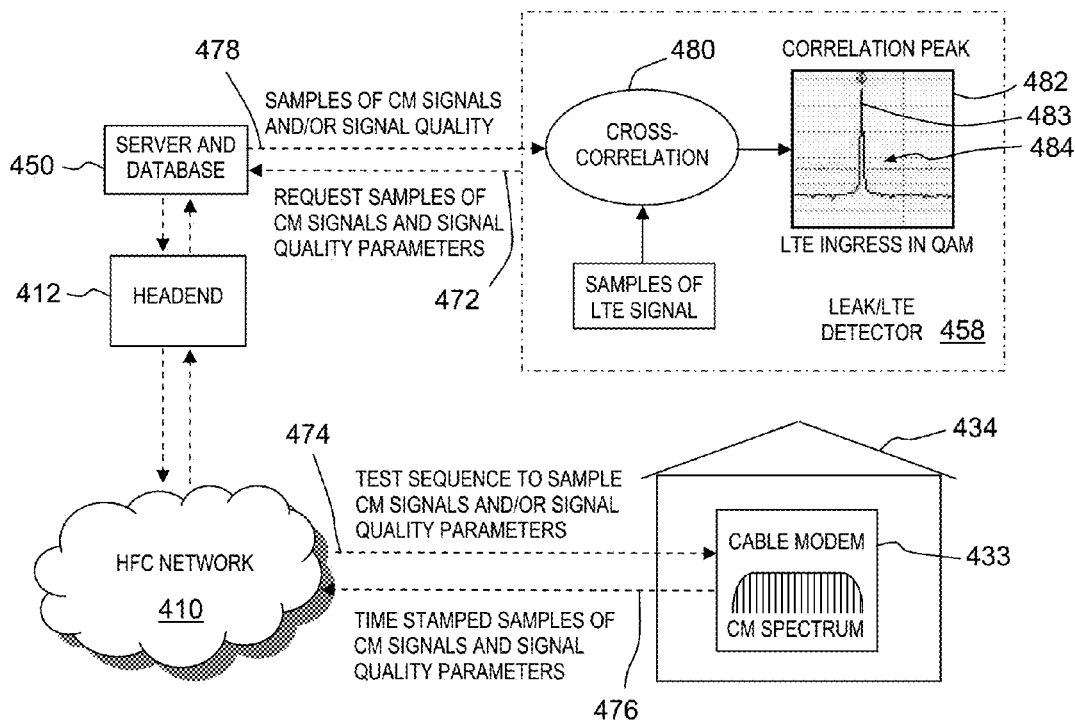
FIG. 12 is a table of assigned repair priorities based on four leak level and LTE signal level combinations, for four priority scenarios—QAM Egress, LTE Ingress (Low QAM level), LTE Ingress (Medium QAM level), and LTE Ingress (High QAM Level)
FIG. 15 is a block diagram and schematic illustration of another embodiment, which utilizes cable modems in the HFC network to obtain samples forward path signals to be used to detect the presence of LTE signal ingress into the HFC network.

Referring now to FIG. 12, there is shown a table of assigned repair priorities based on four Leak Level/LTE Level combinations. There are four priority scenarios—QAM Egress, LTE Ingress (Low QAM level), LTE Ingress (Medium QAM level), and LTE Ingress (High QAM Level). FIG. 12 is a simple example of assigning priorities in accordance with the present invention. The priorities in this example are based on the data presented in FIGS. 8-11. Priorities can be based on statistical or historical data of a particular cable plant, calibration data, theoretical calculations, published data, general experience, or educated assumptions. The Leak Level/LTE Level combinations were simplified by limiting their values to high (H) and low (L), and the four priority scenarios were simplified by limiting the repair priorities to high (H) and low (L). The invention is not limited to this simple example. In a more involved example, the Leak Level/LTE Level combinations may be defined in terms of low, medium and high, and the repair priorities may also be defined by low, medium and high. Of course, the complete data sets of FIGS. 8-11 can be used (e.g., stored in a lookup table) to define a multiplicity of scenarios and priorities. Again, the scope of the invention is not limited to these examples.

In the FIG. 12 example, the low and high Leak level and LTE level and the low and high priorities are defined in the following table:

| AS-SIGN | LEAK LEVEL | LTE LEVEL | QAM Egress Priority | LTE Ingress Priority |
|---|---|---|---|---|
| Low (L) | <20 µV/m | ≥500 Meters | $P_{RX} \leq -110$ dBm | CNR ≥ 33 dB |
| High (H) | 20-500 µV/m | 50-200 Meters | $P_{RX} > -110$ dBm | CNR < 33 dB |

In the table, the LTE level is defined in terms of BTS distance, because the data in FIG. 8-11 happens to be in those terms. Recall, $P_{RX}$ is the power of the QAM egress at the input of a LTE BTS and −110 dBm is the noise floor of the BTS receiver (FIG. 8). CNR is the carrier-to-noise ratio of the selected QAM channel signal inside the cable plant (FIGS. 9-11). In FIG. 12, the QAM signal levels (inside the cable plant) are defined as follows: High is >25 dBmV (FIG. 9); Medium 15-25 dBmV (FIG. 10); and Low is <15 dBmV (FIG. 11). FIG. 12 demonstrates the importance of considering LTE signal level and the QAM signal level (inside cable plant) in establishing meaningful leak repair priorities, in that these parameters redefine priority assignments from those that simply consider leak level. Further, depending on the focus of the repair, priority assignments may also differ. For example, as shown in FIG. 12, a repair focused on QAM egress may have a different set of priorities than one focused on LTE Ingress.

Figure 13:
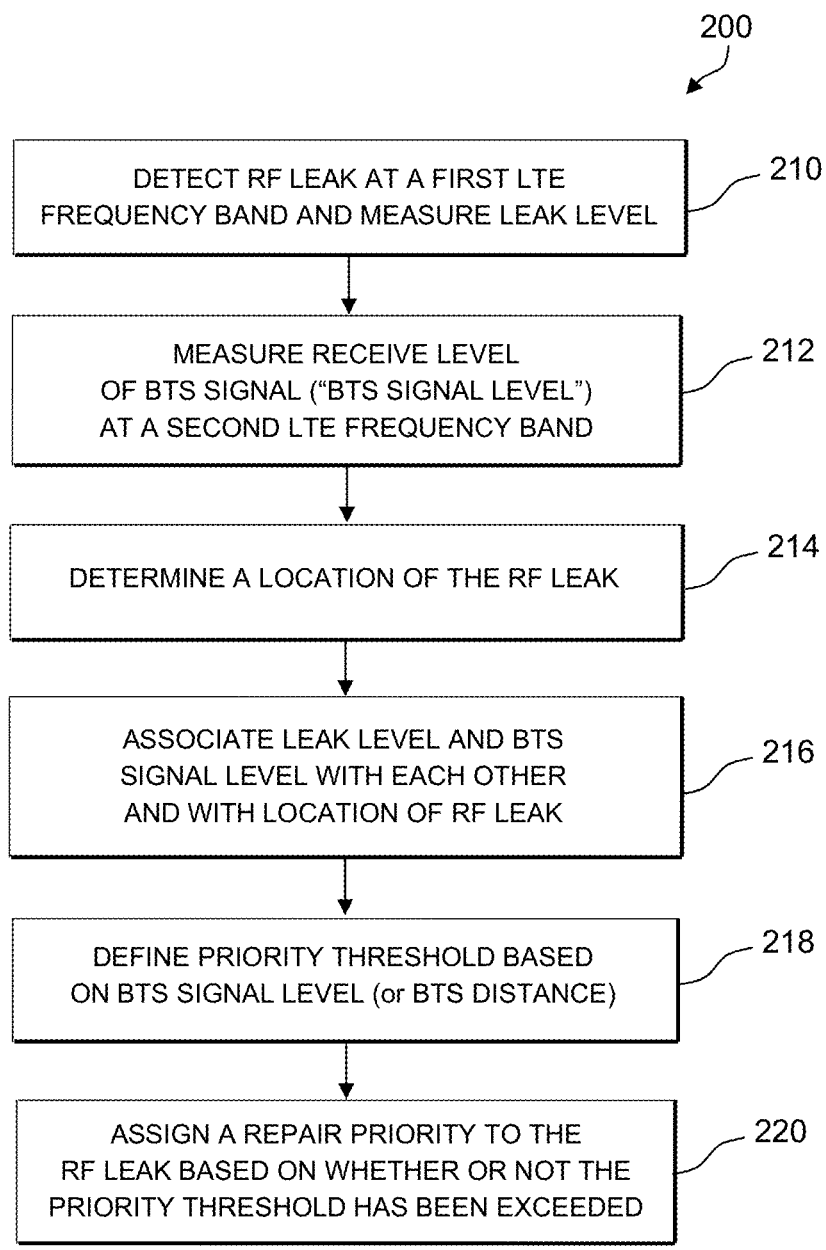
FIG. 13 is a flow diagram outlining one method of the present invention.

A preferred method 200 of prioritizing the repair of leaks is shown in the flow diagram of FIG. 13. In a first step 210, an RF leak is detected at a first LTE frequency band (e.g., at a co-located QAM channel) and the leak level is measured. Step 210 may be carried out by leak/LTE detector 58, as described above. In a second step 212, a signal level of a BIS signal (i.e., BTS signal level) is received and measured by leakage/LTE detector 58 at a second LTE frequency band. The first LTE frequency band of step 210 may, but does not have to, be the same as the second LTE frequency band of step 212. As mentioned with respect to FIG. 3, it is preferred that the BIS signal level be measured for each of the LTE frequency bands, and that the maximum BTS signal level of all the LTE bands be used for prioritization. In a third step 214, the location of the RF leak is determined, for example, by the TDOA process described in U.S. Pat. No. 8,456,530. In a fourth step 216, the leak level measured in step 210 is associated with the BTS signal level measured in step 212, and both measurements are associated with the location of the RF leak. In step 216, the BIS signal level measurement is associated with the leak level measurement, preferably by location (e.g., GPD coordinates) of the measurements and by timestamps. Once the location of the leak is calculated by leakage/LTE detector 58, it is stored with the associated leak level and BTS signal level, or the leak level and BTS signal level are made to point to the stored leak location.

In a fifth step 218, a priority threshold is defined based on the BTS signal level (or BTS distance). In one embodiment, the threshold is a BTS signal level value (or related BTS distance) directly, as discussed above with respect to FIGS. 6 and 7. In the latter embodiment, if the BTS signal level threshold is not exceeded, then generally the leak level need not be considered. If the threshold is exceeded, a priority may be directly assigned to the leak or the leak level will then be considered before assigning a priority. In another embodiment, the threshold is a "minimum allowable leak level" and is defined based on the measured BTS signal level (or BTS distance), as discussed above with respect to FIG. 8. As an example of the latter threshold, assume that the measured BTS signal level is −55 dBm (or 200 meters BTS distance). As understood from FIG. 8, the relationship between BTS signal level (BTS distance) and BTS receiver degradation is dependent on leak level. Thus, from FIG. 8, a minimum allowable leak level (or priority threshold) is determined or defined to be about 200 µV/m. If this leak level is exceeded, a high or heightened priority would be assigned to the leak. In a modification, step 218 is carried out by first converting the BTS signal level to a BTS distance, as described above in the paragraph discussing FIG. 8. Lastly, in a sixth step 220, a repair priority is assigned to the RF leak based on whether or not the priority threshold has been exceeded. This has already been illustrated above with respect to step 218. Method 200 of FIG. 13 is most suited for repairs focused on cable plant egress affecting LTE base stations, although it is not limited to that application.

Figure 14:
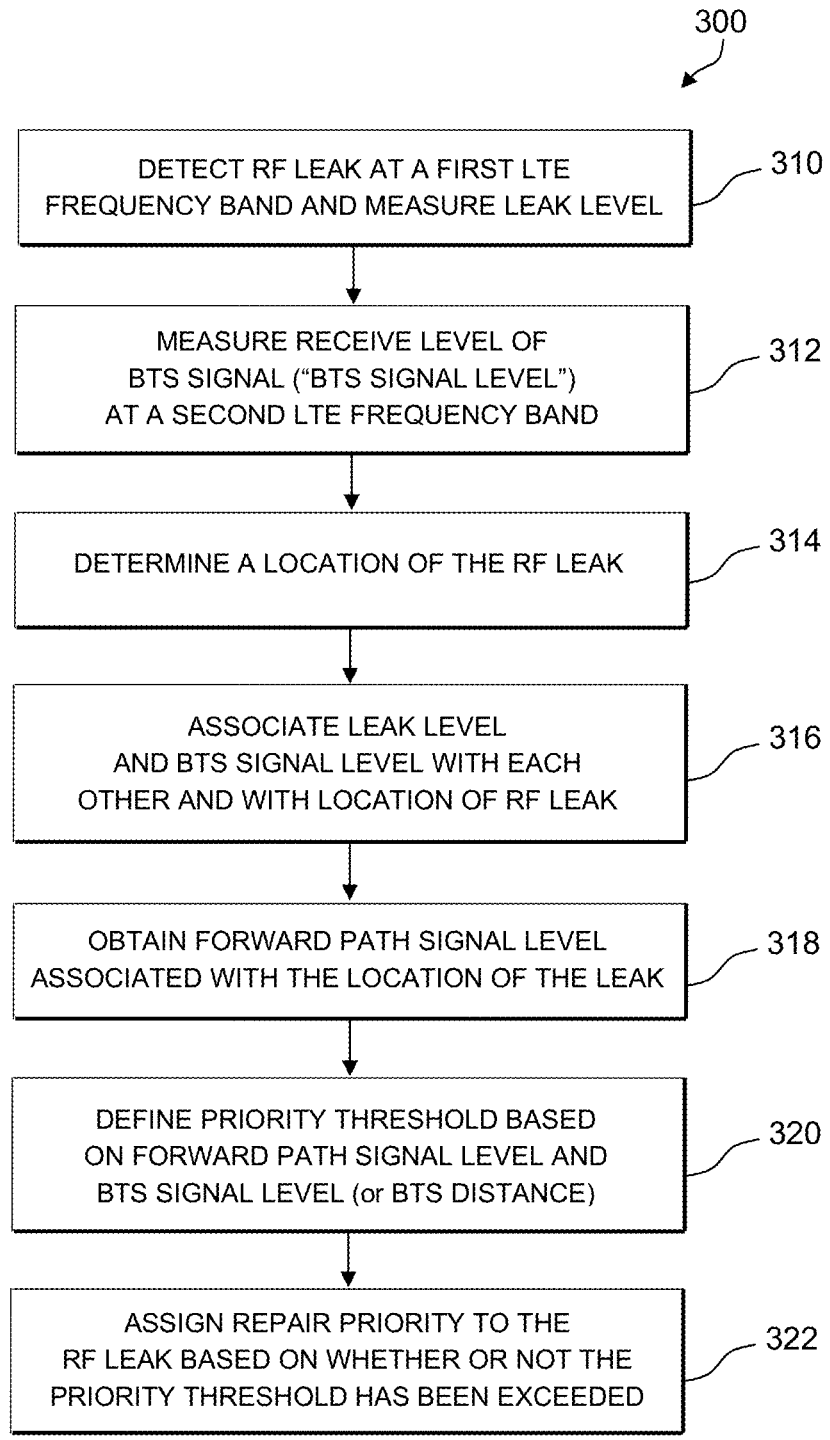
FIG. 14 is a flow diagram outlining another method of the present invention.

Another method 300 of prioritizing the repair of leaks is shown in FIG. 14. The first four steps of method 300—steps 310, 312, 314, and 316—are the same as the first four steps of method 200 of FIG. 13 (i.e., steps 210, 212, 214, and 216). Thus, they will not be repeated here. In FIG. 14, a fifth step 318 includes obtaining the level of a forward path signal in the cable plant (e.g., a QAM channel signal), at approximately the location of the leak, preferably at LTE frequencies. Preferably, the forward path signal level values for most locations in the cable plant will be available from server database 52, as part of previously measured calibration data or as supplied by the cable operator.

In a sixth step 320 in FIG. 14, a priority threshold is defined based on the forward path signal level and the BTS signal level (or BTS distance). Step 320 is demonstrated by the three graphs in FIGS. 9-11. After the leak location is determined, a forward path signal level value that is most closely associated with the leak location is obtained (e.g., retrieved or estimated). Based on this value, the appropriate relationship between forward path CNR, BTS signal level (or BTS distance) and leak level is selected (e.g., FIG. 9, FIG. 10 or FIG. 11). Then, a priority threshold is defined based on the BTS signal level (or BTS distance), as in the method of FIG. 13. As explained for FIG. 13, the priority threshold may be, for example, a BTS signal level value or a minimum allowable leak level. As an example, let us say a forward path signal level of +25 dBmV was retrieved from the server database. Thus, the data plotted on graph 118 in FIG. 10 are selected. In this example, the threshold may be defined as a BTS signal level of −55 dBm (or 200 meters BTS distance), and if this threshold is exceeded at a particular leak location, the leak is assigned a priority (e.g., high, moderate, etc.) without regard to leak level. Alternatively, in this example, the threshold may be defined after the BTS signal level (associated with a leak) is known, which we will say is −60 dBm (or 225 meters BTS distance). Based on the 225 meters, and using FIG. 10, a minimum allowable leak level or leak threshold of 50 µV/m is defined. Thus, if the level of the leak exceeds 50 µV/m, the leak may be assigned a high or heightened repair priority.

Lastly, in a seventh step 322 in FIG. 14, a repair priority is assigned to the RF leak based on whether or not the priority threshold has been exceeded. This has already been described in the immediately preceding paragraph with respect to step 320. Method 300 of FIG. 14 is most suited for repairs focused on LTE ingress affecting forward path signals in the cable plant, although it is not limited to that application.

In another embodiment, confirmation is sought on whether LTE ingress is actually disrupting the cable plant. Customer premise equipment (CPE), preferably cable modems, in the network under test, are utilized to confirm the presence or absence of interfering LTE ingress. In this embodiment, leakage/LTE detector 58 performs essentially the same functions, including leakage detection and location and, optionally, BTS signal level measurements. In addition, however, the LTE BTS signal received by leakage/LTE detector 58 is sampled at about the Nyquist rate (e.g., 10 MHz sampling rate) to produce LTE signal samples. The samples are time stamped and stored for later cross-correlation processing. The timestamps for the LTE signal samples are obtained from a GPS receiver in leak/LTE detector 58, as described in U.S. Pat. No. 8,456,530, which is incorporated herein by reference. The timestamp marks the time when sampling of the LTE BIS signal is initiated and marks the beginning of a sampling interval. At about the same time, during the same sampling interval, a forward path (QAM) signal in the cable network (which may include ingress) is also sampled to produce forward path signal samples, and then the samples are time stamped. Preferably, the forward path signal is sampled inside a cable modem (or modems) connected within the network or node under test. The particular modem or moderns selected to perform sampling may be in the vicinity or downstream of a detected leak.

FIG. 15 is a schematic representation of this other embodiment. Like parts to those in FIG. 1 are represented by like reference numerals in FIG. 15. In FIG. 15, an HFC network 410 includes a headend 412, and communicating with headend 412 is a network server 450 containing a server database. In the field is a leak/LTE detector 458. Within network 410, is a cable modem 433 located, in this case, in a subscriber premises 434. After a leak is detected and its location determined, a request 472 is made from leak/LTE detector 458 via, e.g., a wireless network (e.g., wireless network 66 in FIG. 1) to headend 412 (e.g., via server 450) to initiate forward path signal sampling at selected cable modem 433 or at multiple modems. Request 472 includes information about the location of the leak under test. Request 472 is processed at server 450 and/or at the Cable Modem Termination System (CMTS) in headend 412 (not specifically shown). Modem 433 or multiple modems that perform the sampling are selected based on the leak location or on the particular node under test. As indicated in FIG. 15, headend 412 (e.g., CMTS) or server 450 sends a test sequence 474 to modem 433 or multiple modems to perform the sampling of a particular frequency channel and/or to measure signal quality parameters of that channel. Preferably, the channel's frequencies include the frequency band of the LTE signal received by detector 458. Modem 433 (or multiple modems) then carries out test sequence 474, sampling the forward path signal and time stamping the samples and, if requested, measuring signal quality parameters. The forward path signal is sampled at or near the Nyquist rate (e.g., 10 MHz sampling rate). A timestamp marks the beginning of a sampling interval, within which the forward path signal is sampled. The timestamps applied at the modems may be UTC timestamps. For example, modem 433 may be equipped to generate a UTC timestamp in accordance with the DOCSIS 3.1 specification. Time sync may be obtained from an IP network operating under the PTP 1588 protocol. Cable modem chipsets equipped with a UTC timestamping function are available from Broadcom, Irvine, Calif.

A few more words about timestamps and sampling interval are presented here. The acquisitions of the LTE and forward path signal samples are synchronized so that both sets of samples are taken during the same sampling interval. Synchronization is achieved by applying a timestamp to each of the LTE signal samples and forward path signal samples. This timestamp synchronization process is described in the context of leak detection in U.S. Pat. No. 8,456,530. The length of the sampling interval is greater than the time necessary to sample either the LTE signal or the forward path signal. The interval includes an additional period to cover the maximum propagation delay of the LTE BTS signal entering a leak (as ingress) and traveling through the network to the modem(s) that perform the forward path signal sampling.

Again referring to FIG. 15, a data packet 476 containing the timestamp and forward path signal samples is transmitted upstream from modem 433 (or multiple modems) to server 450. In addition, or as an alternative, data packet 476 may contain time-stamped measurements of signal quality parameters ("signal quality data"). Both sets of data may be sent in a single data packet. Server 450 may compare the signal quality data to pre-determined thresholds and, if the thresholds are exceeded, a high or heightened priority may be assigned to the associated leak. The forward path signal samples are first cross-correlated with the LTE signal samples (from the same sampling interval) to determine whether LTE ingress is present in the forward path signal. A cross-correlation peak will indicate this (see functions of detector 458 in FIG. 15). If ingress is present, a high or heightened priority may be assigned to the associated leak.

In one version of the FIG. 15 embodiment, data packet 476 of the forward path signal samples and/or signal quality data are relayed to leak/LTE detector 458 via, e.g., wireless network 66 (FIG. 1), as indicated in FIG. 15 by a relay transmission 478. In detector 458, the above-mentioned cross-correlation takes place, as indicated by a cross-correlation function block 480 in FIG. 15. Again, the LTE signal samples and forward path signal samples having the same timestamp are cross-correlated. If a correlation peak appears in the correlation function (i.e., output of the cross-correlator), this means that the LTE BTS signals are present as ingress in the forward path signals at the customer's premises (e.g., inside modem 433). FIG. 15 shows detector 458 with a screen display 482, which is displaying a correlation peak 483 in a correlation function 484. The sharpness and amplitude of the correlation peak will be an indicator of whether the ingress will adversely affect signal quality. Thus, a priority may be set for the associated leak depending on the nature of the correlation function.

In another version of the FIG. 15 embodiment, the cross-correlation process occurs at server 450, in which case the LTE signal samples would be sent from detector 458 to the server and the forward path signal samples from cable modem 433 (or multiple modems) would remain at server 450. Further, under this version, the headend or server 450 may request the samples of the forward path signal and signal quality data from modem 433 (or from multiple modems), rather than detector 458. The QAM Snare® Monitor™ or Navigator™ field leakage detector, manufactured by Arcom Digital, LLC, Syracuse, N.Y., may be configured (e.g., programmed) to implement the functions of either version of this other embodiment. Also, detector 458 may contain a separate receiver channel for receiving and sampling the LTE BTS signals. Preferably, however, the tunable receiver already inside the QAM Snare® detector will be used. As indicated with respect to FIG. 3, the receiver is frequency agile enough to tune between desired forward path (QAM) channels and LTE downlink frequencies.

In either version of the FIG. 15 embodiment, the signal quality parameters measured by modem 433 (or other modems) may include RF or carrier signal level, MER, pre & post FEC BER, and uncorrected code word errors. The signal quality parameters may also include pre-equalization coefficients of a cable modem's upstream transmitter, as used in the proactive network maintenance (PNM) system proposed by CableLabs (Louisville, Colo.) in 2008 or as implemented in 2010 by Comcast (Philadelphia, Pa.) in its Scout Flux™ tool.

In the case of modem pre-equalization coefficients, server 450 or the CMTS would include software that can analyze the coefficients and determine if they indicate an ingress or other problem.

Figure 16:
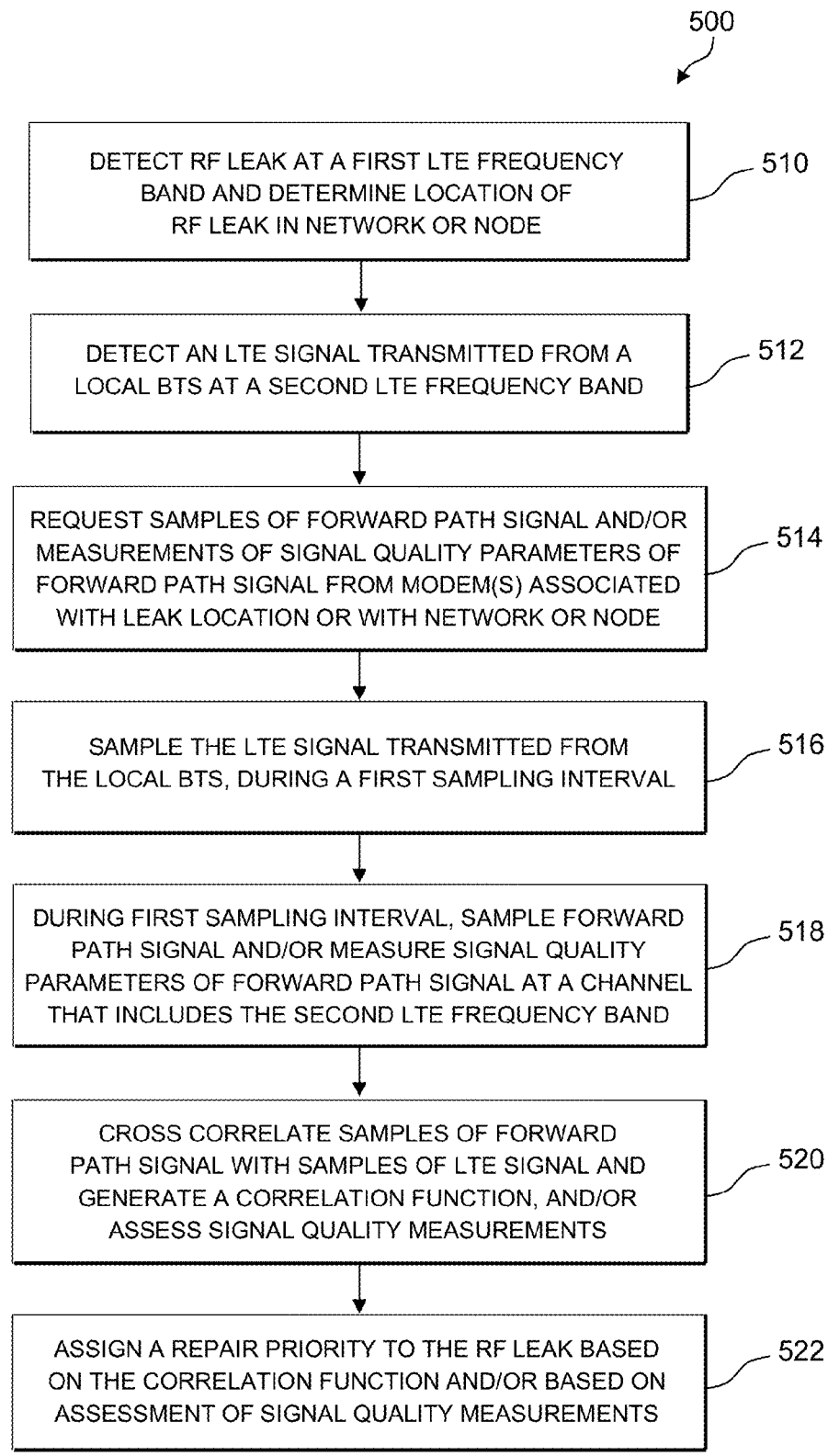
FIG. 16 is a flow diagram outlining a method which corresponds to the embodiment of FIG. 15.

Referring now to FIG. 16, there is shown a flow diagram outlining a method 500 associated with the embodiment of FIG. 15. In a first step 510, an RF leak is detected in HFC network 410 or node at a first LTE frequency band (e.g., at a co-located QAM channel) and the location of the leak is determined. Step 510 is preferably carried out by leakage/LTE detector 458, as described in U.S. Pat. No. 8,456,530. A second step 512 includes detecting an LTE signal transmitted from a local BTS (e.g., BTS 40 in FIG. 1) at a second LTE frequency band. The first LTE frequency band of step 510 may, but does not have to, be the same as the second LTE frequency band of step 512. Step 512 is also preferably carried out by leakage/LTE, detector 458. A third step 514 includes, requesting samples of the forward path signal and/or measurements of signal quality parameters of the forward path signal, from modem 433 or selected modem(s) associated with the leak location or with HFC network 410 or a particular node. In a fourth step 516, the LTE signal is sampled during a first sampling interval (the preferred sampling parameters were given above). In a fifth step 518, at a channel that includes the second LTE frequency band and during the first sampling interval, the forward path signal is sampled to produce forward path signal samples and/or the signal quality parameters of the forward path signal are measured to produce forward path signal quality data. In a sixth step 520, the forward path signal samples are cross correlated with the LTE signal samples and a correlation function (such as correlation function 484 in FIG. 15) is produced. In addition to, or in the alternative, the signal quality data is assessed. Signal quality data may, for example, be assessed by comparing it to pre-determined thresholds indicating signal quality or degradation. As mentioned previously, if the correlation function has a peak (e.g., peak 483 in FIG. 15), the presence of LTE ingress in the forward signals is indicated. Lastly, in a seventh step 522, a repair priority is assigned to the RF leak based on the correlation function and/or assessment of signal quality data. A high or heightened priority may be assigned to the leak if the correlation function includes a peak and/or if one or more signal quality data exceeds a threshold (as an example).

The various functions of the present invention, as described above, may be implemented in hardware, firmware, software, or a combination of these. For example, with respect to hardware, these functions may be implemented in an application specific integrated circuit (ASIC), digital signal processor (DSP), field programmable gate array (FPGA), micro-controller, microprocessor, programmable logic device, general purpose computer, special purpose computer, other electronic device, or a combination of these devices (hereinafter "processor"). If the various functions are implemented in firmware, software, or other computer-executable instructions, then they may be stored on any suitable computer-readable media. Computer-executable instructions may cause a processor to perform the aforementioned functions of the present invention. Computer-executable instructions include data structures, objects, programs, routines, or other program modules accessible and executable by a processor. The computer-readable media may be any available media accessible by a processor. Embodiments of the present invention may include one or more computer-readable media. Generally, computer-readable media include, but are not limited to, random-access memory ("RAM"), read-only memory ("ROM"), programmable read-only memory ("PROM"), erasable programmable read-only memory ("EPROM"), electrically erasable programmable read-only memory ("EEPROM"), compact disk read-only memory ("CD-ROM"), or any other device or component that is capable of providing data or executable instructions accessible by a processor. Certain embodiments recited in the claims may be limited to the use of tangible, non-transitory computer-readable media, and the phrases "tangible computer-readable medium" and "non-transitory computer-readable medium" (or plural variations) used herein are intended to exclude transitory propagating signals per se.

While the preferred embodiments of the invention have been particularly described in the specification and illustrated in the drawing, it should be understood that the invention is not so limited. Many modifications, equivalents and adaptations of the invention will become apparent to those skilled in the art without departing from the spirit and scope of the invention.

What is claimed is:

1. A system for identifying for repair one or more of a plurality of signal leaks in an HFC network carrying a forward path signal affected by a BTS signal transmitted from a base transceiver station and received by the HFC network through the leaks, said system comprising:
   (a) signal detection equipment for detecting the BTS signal near each of the plurality of leaks;
   (b) BTS level means, associated with said signal detection equipment, for determining a level of the BTS signal detected near each of the plurality of leaks, to produce a plurality of BTS signal levels associated with the plurality of leaks, respectively; and
   (c) a processor configured to determine whether the BTS signal is likely to affect the forward path signal of the HFC network at each of the plurality of leaks based on, for each said leak, the BTS signal level associated with said leak,
   whereby if the BTS signal is likely to affect the forward path signal of the HFC network at a leak of the plurality of leaks, then the leak is identified for repair.

2. The system of claim 1, wherein the determination by said processor of whether the BTS signal is likely to affect the forward path signal of the HFC network at each of the plurality of leaks includes, for each said leak, comparing the BTS signal level associated with said leak to a threshold.

3. The system of claim 1, further comprising leak level means associated with said signal detection equipment, said signal detection equipment including a detector for detecting a leak signal emitted from each of the plurality of leaks,
   said leak level means being configured to determine a level of the leak signal from each of the plurality of leaks, to produce a plurality of leak levels associated with the plurality of leaks, respectively, and
   wherein said processor determines whether the BTS signal is likely to affect the forward path signal of the HFC network at each of the plurality of leaks based further on, for each said leak, the leak level associated with said leak.

4. The system of claim 3, wherein the BTS signal is transmitted in a first band of frequencies within an allocation of frequencies utilized by the base transceiver station, and
   wherein the detector of said signal detection equipment is configured to detect the leak signal from each of the plurality of leaks in a second band of frequencies within the allocation of frequencies utilized by the base transceiver station.

5. The system of claim 4, wherein the first band of frequencies is substantially the same as the second band of frequencies.

6. The system of claim 4, wherein the allocation of frequencies utilized by the base transceiver station includes an allocation of downlink frequencies of the base transceiver station.

7. The system of claim 1, wherein the forward path signal of the HFC network is characterized by a plurality of forward path signal levels associated with the plurality of leaks, respectively, and
wherein said processor determines whether the BTS signal is likely to affect the forward path signal of the HFC network at each of the plurality of leaks based further on, for each said leak, the forward path signal level associated with said leak.

8. The system of claim 7, further comprising leak level means associated with said signal detection equipment, said signal detection equipment being configured to detect a leak signal emitted from each of the plurality of leaks,
said leak level means being configured to determine a level of the leak signal from each of the plurality of leaks, to produce a plurality of leak levels associated with the plurality of leaks, respectively, and
wherein said processor determines whether the BTS signal is likely to affect the forward path signal of the HFC network at each of the plurality of leaks based further on, for each said leak, the leak level associated with said leak.

9. The system of claim 8, wherein the HFC network is characterized by a performance parameter having a plurality of parameter values associated with the plurality of leaks, respectively, the plurality of parameter values being related to the plurality of BTS signal levels, respectively, to the plurality of forward path signal levels, respectively, and to the plurality of leak levels, respectively, and
wherein said processor determines whether the BTS signal is likely to affect the forward path signal of the HFC network at each of the plurality of leaks based further on, for each said leak, the parameter value associated with said leak.

10. The system of claim 9, wherein the determination by said processor of whether the BTS signal is likely to affect the forward path signal of the HFC network at each of the plurality of leaks includes, for each said leak, comparing the parameter value associated with said leak to a threshold.

11. The system of claim 9, wherein the performance parameter is a carrier-to-noise ratio parameter.

12. The system of claim 1, wherein:
the base transceiver station transmits a plurality of BTS signals in a plurality of BTS frequency bands, respectively;
said signal detection equipment detects the plurality BTS signals near each of the plurality of leaks;
said BTS level means measures a level for each of the plurality of BTS signals detected near each of the plurality of leaks; and
the BTS signal level associated with each of the plurality of leaks is determined, for each said leak, from the levels of the plurality of BTS signals measured near said leak.

13. The system of claim 12, wherein the BTS signal level associated with each of the plurality of leaks is, for each said leak, the maximum level of the levels of the plurality of BTS signals measured near said signal leak.

14. The system of claim 1, further comprising means for generating a user interface screen display that displays each leak identified for repair.

15. The system of claim 14, wherein the user interface screen display displays a map of at least a portion of the HFC network and, for each leak identified for repair, an icon marking the location of the leak on the map.

16. A method of identifying for repair one or more of a plurality of signal leaks in an HFC network carrying a forward path signal affected by a BTS signal transmitted from a base transceiver station and received by the HFC network through the plurality of leaks, said method comprising the steps of:
(a) detecting the BTS signal near each of the plurality of leaks;
(b) determining a level of the BTS signal detected near each of the plurality of leaks to produce a plurality of BTS signal levels associated with the plurality of leaks, respectively;
(c) determining whether the BTS signal is likely to affect the forward path signal of the HFC network at each of the plurality of leaks based on, for each said leak, the BTS signal level associated with said leak; and
(d) identifying said leak for repair if it is determined that the BTS signal is likely to affect the forward path signal of the HFC network at said leak.

17. The method of claim 16, wherein step (c) includes, for each said leak, comparing the BTS signal level associated with said leak to a threshold.

18. The method of claim 16, further comprising the steps of—
(e) detecting a leak signal emitted from each of the plurality of leaks, and
(f) determining a level of the leak signal from each of the plurality of leaks to produce a plurality of leak levels associated with the plurality of leaks, respectively, and
wherein step (c) includes determining whether the BTS signal is likely to affect the forward path signal of the HFC network at each of the plurality of leaks based further on, for each said leak, the leak level associated with said leak.

19. The method of claim 18, wherein the BTS signal is transmitted in a first band of frequencies within an allocation of frequencies utilized by the base transceiver station, and
wherein step (e) includes detecting the leak signal from each of the plurality of leaks in a second band of frequencies within the allocation of frequencies utilized by the base transceiver station.

20. The method of claim 16, wherein the forward path signal of the HFC network is characterized by a plurality of forward path signal levels associated with the plurality of leaks, respectively, and
wherein step (c) includes determining whether the BTS signal is likely to affect the forward path signal of the HFC network at each of the plurality of leaks based further on, for each said leak, the forward path signal level associated with said leak.

21. The method of claim 20, further comprising the steps of—
(e) detecting a leak signal emitted from each of the plurality of leaks, and
(f) determining a level of the leak signal from each of the plurality of leaks to produce a plurality of leak levels associated with the plurality of leaks, respectively, and
wherein step (c) includes determining whether the BTS signal is likely to affect the forward path signal of the HFC network at each of the plurality of leaks based further on, for each said leak, the leak level associated with said leak.

22. The method of claim 21, wherein the HFC network is characterized by a performance parameter having a plurality of parameter values associated with the plurality of leaks, respectively, the plurality of parameter values being related to (i) the plurality of BTS signal levels, respectively, (ii) the plurality of forward path signal levels, respectively, and (iii) the plurality of leak levels, respectively, and wherein step (c) includes determining whether the BTS signal is likely to affect the forward path signal of the HFC network at each of the plurality of leaks based further on, for each said leak, the parameter value associated with said leak.

23. The method of claim 16, wherein:

the base transceiver station transmits a plurality of BTS signals in a plurality of BTS frequency bands, respectively;

step (a) includes detecting the plurality of BTS signals near each of the plurality of leaks; and step (b) includes measuring a level for each of the plurality of BTS signals detected near each of the plurality of leaks, the BTS signal level associated with each of the plurality of signal leaks being determined, for each said leak, from the levels of the plurality of BTS signals measured near said signal leak.

24. A system for identifying for repair a signal leak in an HFC network carrying a forward path signal affected by a BTS signal transmitted from a base transceiver station and received by the HFC network through the leak, said system comprising:

(a) signal detection equipment for detecting the BTS signal near the leak;

(b) BTS level means, associated with said signal detection equipment, for determining a level of the BTS signal detected near the leak; and (c) a processor configured to determine whether the BTS signal is likely to affect the forward path signal of the HFC network at the leak based on the level of the BTS signal detected near the leak;

whereby if the BTS signal is likely to affect the forward path signal of the HFC network at the leak, then the leak is identified for repair.

25. A non-transitory computer-readable medium containing computer-executable instructions to operate a system for identifying for repair one or more of a plurality of signal leaks in an HFC network, the HFC network carrying a forward path signal affected by a BTS signal transmitted from a base transceiver station and received by the HFC network through the plurality of leaks, the computer-executable instructions causing the system to perform a method comprising the steps of:

(a) detecting the BTS signal near each of the plurality of leaks;

(b) determining a level of the BTS signal detected near each of the plurality of leaks to produce a plurality of BTS signal levels associated with the plurality of leaks, respectively;

(c) determining whether the BTS signal is likely to affect the forward path signal of the HFC network at each of the plurality of leaks based on, for each said leak, the BTS signal level associated with said leak; and (d) identifying said leak for repair if it is determined that the BTS signal is likely to affect the forward path signal of the HFC network at said leak.

26. A method of identifying for repair a signal leak in an HFC network, the HFC network being in the vicinity of a base transceiver station that transmits over-the-air a plurality of BTS signals in a plurality of BTS frequency bands, respectively, said method comprising the steps of:

(a) detecting near the leak the plurality of BTS signals in the plurality of BTS frequency bands, respectively;

(b) measuring a level of each of the plurality of BTS signals detected near the leak, to produce a plurality of measured signal levels;

(c) determining a BTS signal level from the plurality of measured signal levels; and (d) determining whether the leak is to be identified for repair based on the BTS signal level.

27. The method of claim 26, wherein step (c) includes determining the BTS signal level by selecting the maximum level of the plurality of measured signal levels.

28. A method of identifying for repair a signal leak in an HFC network, the leak emitting a leak signal over-the-air and a base transceiver station in the vicinity of the HFC network transmitting a BTS signal over-the-air, the HFC network being characterized by a performance parameter, said method comprising the steps of:

(a) detecting the leak signal and the BTS signal near the leak;

(b) determining a level of the BTS signal detected near the leak, to produce a BTS signal level associated with the leak;

(c) determining a level of the leak signal detected near the leak, to produce a leak level associated with the leak;

(d) determining a value of the performance parameter based on the BTS signal level determined in step (b) and the leak level determined in step (c); and (e) determining whether the leak is to be identified for repair by comparing the value of the performance parameter to a threshold.

29. The method of claim 28, wherein the performance parameter is a carrier-to-noise ratio parameter of the HFC network.

30. A method of identifying for repair a signal leak in an HFC network that carries a forward path signal associated with the leak, and wherein a base transceiver station in the vicinity of the HFC network transmits a BTS signal over-the-air, said method comprising the steps of:

(a) detecting the BTS signal in the vicinity of the leak;

(b) determining a level of the BTS signal detected in step (a);

(c) obtaining a level of the forward path signal associated with the leak; and (d) with the use of a processor, determining whether the leak should be identified for repair based on the level of the BTS signal determined in step (b) and the level of the forward path signal obtained in step (c).

31. The method of claim 30, further comprising the step of:

(e) defining a threshold based on the level of the forward path signal obtained in step (c); and wherein step (d) includes comparing the level of the BTS signal determined in step (b) to the threshold defined in step (e).

32. A method of identifying for repair a signal leak in an HFC network, wherein a base transceiver station transmits over-the-air a BTS signal which enters the HFC network through the leak and is combined with a forward path signal in the HFC network, said method comprising the steps of:

(a) receiving over-the-air the BTS signal near the leak;

(b) during a first sampling interval, sampling the BTS signal received in step (a) to produce a set of BTS signal samples;

(c) during the first sampling interval, sampling the forward path signal in the HFC network to produce a set of forward path signal samples;

(d) cross correlating the set of forward path signal samples with the set of BTS signal samples to produce a correlation output; and (e) identifying the leak for repair if the correlation output signifies a substantial presence of the BTS signal with the forward path signal.

33. The method of claim 32, wherein step (c) includes sampling the forward path signal at a point in the HFC network near the signal leak.

34. The method of claim 33, wherein the point in the HFC network is a cable modem, and wherein step (c) includes sampling the forward path signal in the cable modem.

35. The method of claim 32, wherein the HFC network includes a node, the location of the signal leak being in a part of the HFC network serviced by the node, and wherein step (c) includes sampling the forward path signal at a point in the node.

36. The method of claim 35, wherein the point in the node is a cable modem, and wherein step (c) includes sampling the forward path signal in the cable modem.

37. The method of claim 32, wherein step (e) includes identifying the leak for repair if the correlation output contains a peak.

* * * * *